US010219333B2

United States Patent
Song et al.

(10) Patent No.: US 10,219,333 B2
(45) Date of Patent: Feb. 26, 2019

(54) BACKLIGHT MODULE WITH MJT LED AND BACKLIGHT UNIT INCLUDING THE SAME

(71) Applicant: Seoul Semiconductor Co., Ltd., Ansan-si (KR)

(72) Inventors: Young Jun Song, Ansan-si (KR); Hyuck Jung Choi, Ansan-si (KR); Il Kyung Suh, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 0 days.

(21) Appl. No.: 15/279,998

(22) Filed: Sep. 29, 2016

(65) Prior Publication Data

US 2017/0019968 A1   Jan. 19, 2017

Related U.S. Application Data

(63) Continuation of application No. 14/812,437, filed on Jul. 29, 2015, which is a continuation-in-part of
(Continued)

(30) Foreign Application Priority Data

Mar. 6, 2014   (KR) .......................... 10-2014-0026574
Jul. 3, 2015   (KR) .......................... 10-2015-0095536

(51) Int. Cl.
*H05B 33/08*   (2006.01)
*H01L 33/62*   (2010.01)
(Continued)

(52) U.S. Cl.
CPC ... *H05B 33/0815* (2013.01); *G02F 1/133603* (2013.01); *G02F 1/133606* (2013.01);
(Continued)

(58) Field of Classification Search
CPC ............ H05B 33/0815; H05B 33/0827; H05B 33/083; H05B 33/0845; H05B 37/02;
(Continued)

(56) References Cited

U.S. PATENT DOCUMENTS 9,664,340 B2 * 5/2017 Yao .......................... F21K 9/232
9,769,897 B2 * 9/2017 Song ................... H05B 33/0845
(Continued)

FOREIGN PATENT DOCUMENTS

CN   102132429   7/2011
CN   102216975   10/2011
(Continued)

OTHER PUBLICATIONS

Non Final Office Action dated Apr. 6, 2017, in U.S. Appl. No. 14/812,437.
(Continued)

*Primary Examiner* — Haissa Philogene
(74) *Attorney, Agent, or Firm* — H.C. Park & Associates, PLC

(57) ABSTRACT

A direct type backlight unit disposed under a liquid crystal panel includes a backlight module including a printed circuit board including blocks arranged in an M×N matrix, in which M and N are natural numbers of 2 or greater, light emitting devices disposed on the printed circuit board such that at least one light emitting device is disposed in each block, each of the light emitting devices including light emitting cells disposed on a single substrate, and optical members disposed on the light emitting devices, each of the optical members being configured to change a light beam distribution of a corresponding light emitting device, and a backlight control module configured to control dimming levels of the light emitting devices and to independently control the light emitting devices disposed in different blocks.

20 Claims, 22 Drawing Sheets

Related U.S. Application Data application No. 14/339,051, filed on Jul. 23, 2014, now Pat. No. 9,853,189.

(51) Int. Cl.

| | | |
|---|---|---|
| *H01L 27/15* | (2006.01) | |
| *H01L 33/58* | (2010.01) | |
| *G02F 1/1335* | (2006.01) | |
| *H01L 25/075* | (2006.01) | |
| *H01L 33/00* | (2010.01) | |
| *H01L 33/06* | (2010.01) | |
| *H01L 33/12* | (2010.01) | |
| *H01L 33/32* | (2010.01) | |
| *H01L 33/42* | (2010.01) | |
| *H01L 33/46* | (2010.01) | |
| *H01L 33/50* | (2010.01) | |
| *H01L 33/56* | (2010.01) | |
| *H01L 33/38* | (2010.01) | |
| *H01L 33/14* | (2010.01) | |
| *H01L 33/20* | (2010.01) | |

(52) U.S. Cl.
CPC ........ *H01L 25/0753* (2013.01); *H01L 27/156* (2013.01); *H01L 33/007* (2013.01); *H01L 33/06* (2013.01); *H01L 33/12* (2013.01); *H01L 33/145* (2013.01); *H01L 33/32* (2013.01); *H01L 33/385* (2013.01); *H01L 33/42* (2013.01); *H01L 33/46* (2013.01); *H01L 33/502* (2013.01); *H01L 33/56* (2013.01); *H01L 33/58* (2013.01); *H01L 33/62* (2013.01); *H05B 33/086* (2013.01); *H05B 33/0827* (2013.01); *H05B 33/0845* (2013.01); *G02F 2001/133612* (2013.01); *H01L 33/20* (2013.01); *H01L 2933/005* (2013.01); *H01L 2933/0016* (2013.01); *H01L 2933/0025* (2013.01); *H01L 2933/0041* (2013.01); *H01L 2933/0066* (2013.01)

(58) Field of Classification Search
CPC .............. H05B 33/0842; H05B 37/029; Y02B 20/347; Y02B 20/346; H01L 2224/48091; H01L 33/145; H01L 33/62; H01L 33/486; H01L 25/0753; G09G 3/3406; G02F 1/1335; G02F 1/133603; F21V 5/048
USPC ...... 315/186, 185 R, 291, 307; 345/102, 204
See application file for complete search history.

(56) References Cited

U.S. PATENT DOCUMENTS

| | | | |
|---|---|---|---|
| 9,853,189 B2* | 12/2017 | Song | H05B 33/086 |
| 10,051,705 B2* | 8/2018 | Song | H05B 33/0845 |
| 2004/0070855 A1* | 4/2004 | Benitez | G02B 3/02 |
| | | | 359/858 |
| 2009/0091265 A1 | 4/2009 | Song et al. | |
| 2010/0045190 A1* | 2/2010 | Cramer | H05B 33/0854 |
| | | | 315/151 |
| 2010/0059768 A1* | 3/2010 | Hasnain | H01L 27/153 |
| | | | 257/93 |
| 2010/0156775 A1 | 6/2010 | Yu | |
| 2011/0164069 A1 | 7/2011 | Thompson et al. | |
| 2011/0175122 A1 | 7/2011 | Kim | |
| 2012/0146066 A1 | 6/2012 | Tischler et al. | |
| 2012/0176037 A1 | 7/2012 | Lee | |
| 2012/0236532 A1 | 9/2012 | Koo et al. | |
| 2013/0010230 A1 | 1/2013 | Matsuki et al. | |
| 2013/0020589 A1 | 1/2013 | Yu et al. | |
| 2013/0020929 A1 | 1/2013 | Van de Ven et al. | |
| 2013/0322115 A1* | 12/2013 | Parker | F21V 9/10 |
| | | | 362/608 |
| 2013/0329163 A1* | 12/2013 | Wu | G02F 1/133603 |
| | | | 349/64 |
| 2014/0139499 A1 | 5/2014 | Hussain et al. | |
| 2014/0175465 A1 | 6/2014 | Lee et al. | |
| 2014/0184980 A1 | 7/2014 | Onoue | |
| 2014/0247295 A1 | 9/2014 | Hussain et al. | |
| 2015/0009452 A1 | 1/2015 | Lee et al. | |
| 2015/0061988 A1 | 3/2015 | Galu | |
| 2015/0077644 A1 | 3/2015 | Menon et al. | |
| 2015/0130371 A1* | 5/2015 | Lee | H05B 33/0851 |
| | | | 315/307 |
| 2015/0300594 A1 | 10/2015 | Lee et al. | |

FOREIGN PATENT DOCUMENTS

| | | |
|---|---|---|
| EP | 2 202 563 | 6/2010 |
| JP | 2012-73481 | 4/2012 |
| JP | 2012-243641 | 12/2012 |
| JP | 2014-022489 | 2/2014 |
| JP | 2014-026933 | 2/2014 |

OTHER PUBLICATIONS

Final Office Action dated Jun. 2, 2017, in U.S. Appl. No. 14/339,051.
Non-Final Office Action dated Sep. 8, 2016, in U.S. Appl. No. 14/339,051.
International Search Report issued in corresponding Application No. PCT/KR2014/006745, dated Dec. 5, 2014.
Written Report of International Searching Authority in International Application No. PCT/KR2014/006745, dated Dec. 5, 2014.
Non-Final Office Action dated Mar. 17, 2016, in U.S. Appl. No. 14/812,437.
Final Office Action dated Oct. 6, 2016, in U.S. Appl. No. 14/812,437.
Final Office Action dated Oct. 10, 2017, in U.S. Appl. No. 14/812,437.
Notice of Allowance dated Oct. 10, 2017, in U.S. Appl. No. 14/339,051.
Non-Final Office Action dated Jul. 31, 2017, in U.S. Appl. No. 15/338,673.
Non-Final Office Action dated Jul. 31, 2017, in U.S. Appl. No. 14/338,644.
Non-Final Office Action dated Jul. 14, 2017, in U.S. Appl. No. 15/223,780.
Non-Final Office Action dated Jan. 4, 2018, issued in the U.S. Appl. No. 15/223,780.
Non-Final Office Action dated Jul. 11, 2018, in U.S. Appl. No. 14/812,437.
Final Office Action dated Mar. 13, 2018, issued in U.S. Appl. No. 15/338,673.
Non-Final Office Action dated Oct. 10, 2018, in U.S. Appl. No. 15/338,673.

* cited by examiner b > a

BACKLIGHT MODULE WITH MJT LED AND BACKLIGHT UNIT INCLUDING THE SAME

CROSS-REFERENCE TO RELATED APPLICATIONS

This application is a continuation of U.S. patent application Ser. No. 14/812,437, filed on Jul. 29, 2015, which is a continuation-in-part of U.S. patent application Ser. No. 14/339,051, filed on Jul. 23, 2014, and claims priority from and the benefit of Korean Patent Application No. 10-2014-0026574, filed on Mar. 6, 2014, and Korean Patent Application No. 10-2015-0095536, filed on Jul. 3, 2015, all of which are hereby incorporated by reference for all purposes as if fully set forth herein.

BACKGROUND

Field

The present disclosure relates to a backlight module using a multi junction technology (MJT) light emitting diode (LED) and a backlight unit including the same. More particularly, the present disclosure relates to a backlight module which employs an MJT LED configured to increase an effective light emitting area of each of light emitting cells to allow operation at low current, and a backlight unit including the same.

Description of the Background

A liquid crystal display creates an image by controlling transmittance of a backlight light source. Although a cold cathode fluorescent lamp (CCFL) has generally been used as a backlight light source in the related art, light emitting diodes (hereinafter, LEDs) are being recently used due to various advantages such as low power consumption, long lifespan, eco-friendliness, and the like.

Backlight units can be classified into edge type backlight units and direct type backlight units according to the locations of LEDs for backlighting a liquid crystal display. In an edge type backlight unit, with LEDs arranged as light sources on a side surface of a light guide plate, light entering the light guide plate from the light sources is used for backlighting of a liquid crystal panel. Thus, the edge type backlight unit can reduce the number of LEDs and does not require strict control of quality deviation among the LEDs, thereby enabling manufacture of low power consumption products, which is advantageous in terms of cost. However, in the edge type backlight unit it is difficult to overcome contrast between a corner area and a central area of the liquid crystal display and it is difficult to create high quality images.

Alternatively, a direct type backlight unit is placed under a liquid crystal panel and allows light emitted from a surface light source, which has substantially the same area as that of the liquid crystal panel, to directly illuminate a front side of the liquid crystal panel. The direct type backlight unit can overcome contrast difference between a corner area and a central area of the liquid crystal display and can achieve high quality images.

However, in the direct type backlight unit, if each of the LEDs does not illuminate a relatively wide area for backlighting, a number of LEDs must be densely arranged, thereby causing increase in power consumption. Moreover, deviation in quality between the LEDs can make it difficult to secure a uniform screen illumination due to uneven backlighting of a liquid crystal panel.

Particularly, with the increasing size of liquid crystal panels, the size of the direct type backlight unit is also increased, thereby causing deterioration in stability or reliability of the direct type backlight unit. Specifically, since the LED backlight unit controls the operating current supplied to a plurality of LED groups, that is, LED arrays, through a plurality of LED drive circuits, the number of LED drive circuits and the number of LED corresponding arrays are significantly increased as the size of the LED backlight unit increases. As a result, a disconnection can occur between the plurality of LEDs or LED arrays arranged adjacent each other, whereby the drive circuits are damaged due to overcurrent, overvoltage, or overheating, thereby deteriorating the stability and reliability of the backlight unit.

FIG. 1 is a configuration block diagram of a typical backlight unit using LEDs in the related art. With reference to FIG. 1, problems of the related art will be described in more detail. As shown in FIG. 1, a typical backlight unit 1 includes a backlight control module 2 and a backlight module 5.

The backlight control module 2 includes an operating power generator 3, which generates/outputs DC power based on input voltage Vin input from an external power source, and an operation controller 4 controlling operation of each of a plurality of LED arrays 6a~6n constituting the backlight module 5. The operating power generator 3 generally generates DC voltages such as 12V, 24V, 48V, and the like as operating power.

The backlight module 5 includes a plurality of LED arrays 6a~6n each formed by connecting a plurality of LEDs in series, and an optical unit (not shown) for enhancing efficacy of light emitted from the plurality of LED arrays 6a~6n. In FIG. 1, the backlight module 5 includes n LED arrays 6a~6n connected to each other in parallel and each including five LEDs connected to each other in series. Here, since each of the LEDs used in the backlight unit generally has a forward voltage level in the range from 3V to 6.5V and is difficult to individually control/operate when connected to the operating power generator 3, plural LEDs are connected to each other in series to constitute LED arrays such that each of the LED arrays can be operated/controlled. In such a typical backlight unit 1 in the related art, the operation controller 4 is configured to control brightness of all of the LED arrays 6a~6n constituting the backlight module 5 through pulse width modulation (PWM) control with respect to the operating power supplied to the backlight module 5 in response to an external dimming signal (Dim). Otherwise, in such a typical backlight unit 1, the operation controller 4 adjusts the operating current flowing through a specific LED array among the n LED arrays 6a~6n in response to an external dimming signal (Dim) to control brightness of the specific LED array.

LEDs used in such a typical backlight unit 1 are generally single-cell LEDs capable of being operated at low voltage and high current. For example, such a single-cell LED has an operating voltage of 3.6V and can be operated at an operating current of 250~500 mA. Thus, in order to control operation of the backlight module 5 constituted by such single-cell LEDs, peripheral circuits including the operation controller 4 in the related art must be constituted by large capacity electronic devices capable of handling large current, thereby causing increase in manufacturing costs of the backlight unit 1. In addition, the peripheral circuits including the operation controller 4 are damaged due to the high current operation characteristics of the aforementioned typical single-cell LEDs, thereby causing deterioration in stability or reliability of the backlight unit 1. In addition, the high current operation characteristics of the single-cell LEDs cause an increase in power consumption and a droop phenomenon.

SUMMARY

The present disclosure is aimed at providing a backlight module which can be operated at low current using an MJT LED including a plurality of light emitting cells and a backlight unit including the same.

In addition, the present disclosure is aimed at providing an MJT LED chip, which can increase an effective light emitting area of a light emitting cell, and a method of manufacturing the same.

Further, the present invention is aimed at providing a backlight unit, which allows a backlight module to be operated at low current using the aforementioned MJT LED, thereby improving stability and reliability of drive circuits for controlling operation of the backlight module, and enabling reduction in manufacturing costs.

Further, the present disclosure is aimed at providing a backlight unit, which allows a backlight module to be operated at low current using the aforementioned MJT LED, thereby improving power efficiency and luminous efficacy while preventing a droop phenomenon due to operation at high current.

Further, the present disclosure is aimed at providing a backlight unit, in which a backlight module is constituted by MJT LEDs, thereby minimizing the number of LEDs while enabling individual control of the MJT LEDs.

The above and other objects and advantageous effects of the present disclosure can be obtained by the following features of the present disclosure.

In accordance with one aspect of the present disclosure, a backlight module includes a printed circuit board; a plurality of MJT LEDs disposed on the printed circuit board; and a plurality of optical members disposed on the MJT LEDs or the printed circuit board so as to correspond to the MJT LEDs and each including a light incident face through which light emitted from the corresponding MJT LED enters the optical member and a light exit face through which light exits the optical member at a wider beam angle than that of the corresponding MJT LED, wherein each of the MJT LEDs includes a first light emitting cell and a second light emitting cell separated from each other on a growth substrate; a first transparent electrode layer placed on the first light emitting cell and electrically connected to the first light emitting cell; a current blocking layer placed between the first light emitting cell and the first transparent electrode layer and separating a portion of the first transparent electrode layer from the first light emitting cell; an interconnection line electrically connecting the first light emitting cell to the second light emitting cell; and an insulation layer separating the interconnection line from a side surface of the first light emitting cell. Here, the second light emitting cell has a slanted side surface; and the interconnection line includes a first connection section for electrical connection to the first light emitting cell and a second connection section for electrical connection to the second light emitting cell. The first connection section contacts the first transparent electrode layer within an upper area of the current blocking layer, and the second connection section contacts the slanted side surface of the second light emitting cell.

In one aspect, each of the MJT LEDs includes first to N-th light emitting cells (N being a natural number of 2 or more), and the N-th light emitting cell may be electrically connected to a (N−1)th light emitting cell using the same structure as a connection structure between the first light emitting cell and a second light emitting cell.

In one aspect, the first to N-th light emitting cells are connected to each other in series and each operated by an operating voltage of 2.5V to 4 V. Here, each of the MJT LEDs may be operated at an operating voltage of at least 10 V or more.

In one aspect, each of the MJT LEDs includes three light emitting cells each being operated at an operating voltage of 3V to 3.6V, and is operated at an operating voltage of 12V to 14V.

In one aspect, the light exit face includes a concave section formed near a central axis of the optical member and a convex section extending from the concave section and separated from the central axis of the optical member.

In one aspect, the light exit face includes a total reflection surface so as to form an apex under the central axis of the optical member.

In one aspect, the light incident face includes an opening formed near the central axis of the optical member, and the height of the opening is 1.5 times or more a width thereof.

In one aspect, each of the optical members has a light scattering pattern formed on at least a portion of a bottom surface facing the printed circuit board.

In one aspect, each of the optical members includes a lower surface having a concave section, through which light emitted from the MJT LED enters the optical member; and an upper surface through which light entering the optical member through the concave section exits the optical member. Here, the upper surface includes a concave surface placed at the central axis of the optical member, and the concave section of the lower surface includes at least one of a perpendicular surface relative to the central axis and a downwardly convex surface, and the at least one of the perpendicular surface relative to the central axis and the downwardly convex surface may be placed within a narrower area than an area for an entrance of the concave section.

In one aspect, the upper surface and the concave section of the optical member form a mirror symmetry structure relative to a plane passing through the central axis of the optical member.

In one aspect, the upper surface and the concave section of the optical member form a rotational body shape relative to the central axis of the optical member.

In one aspect, each of the optical members has a light scattering pattern formed on the at least one of the perpendicular surface relative to the central axis and the downwardly convex surface within the concave section of the lower surface and on a surface closer to the central axis than the at least one surface.

In one aspect, each of the optical members has a light scattering pattern formed on the concave surface of the upper surface.

In one aspect, each of the optical members further includes a material layer having a different index of refraction than the optical member on the at least one of the perpendicular surface relative to the central axis and the downwardly convex surface within the concave section of the lower surface and on a surface closer to the central axis than the at least one surface.

In one aspect, each of the optical members further includes a material layer having a different index of refraction than the optical member on the concave surface of the upper surface.

In one aspect, the at least one of the perpendicular surface relative to the central axis and the downwardly convex surface is defined within a narrower area than an area surrounded by an inflection curve at which the concave surface of the upper surface meets the convex surface thereof.

In one aspect, the at least one of the perpendicular surface relative to the central axis and the downwardly convex surface is defined within a narrower area than an area of a light exit face of the light emitting diode.

In one aspect, each of the optical members further includes a flange connecting the upper surface and the lower surface and the at least one of the perpendicular surface relative to the central axis and the downwardly convex surface within the concave section is placed above the flange.

In one aspect, each of the optical members has an optical axis L, a light incident section, and a light exit face, and is formed of a material, the index of refraction of which is higher than that of a material adjoining the light incident section and that of a material adjoining the light exit face.

In one aspect, the light incident section is formed such that the shortest distance from a point (p) on the optical axis L to an apex of the light incident section is greater than the shortest distance (a) from the point (p) to a side surface of the light incident section within an angle of 50° or less from the optical axis L.

In one aspect, an upper center of the light exit face is formed of a flat surface or a convex curve.

In one aspect, the light incident section includes a lower entrance placed adjacent the light emitting diode and having a circular shape, and has a shape gradually converging to the apex while maintaining a circular shape.

In one aspect, the light incident section has a height which is 1.5 times greater than a radius of the lower entrance.

In one aspect, the material adjoining the light incident section is air.

In one aspect, the material adjoining the light exit face is air.

In one aspect, the optical members are formed of a resin or glass.

In accordance with another aspect of the present disclosure, a backlight unit includes the aforementioned backlight module; and a backlight control module supplying DC operating voltage to the plurality of MJT LEDs within the backlight module and independently controlling operation of each of the plurality of MJT LEDs.

In one aspect, the backlight control module supplies the DC operating voltage to each of the plurality of MJT LEDs within the backlight module, and performs pulse width modulation control with respect to the DC operating voltage supplied to at least one MJT LED among the plurality of MJT LEDs in response to a dimming signal to perform dimming control of the at least one MJT LED.

In one aspect, the backlight control module allows independent detection and control of operating current of each of the plurality of MJT LEDs within the backlight module, and controls operating current of at least one MJT LED among the plurality of MJT LEDs in response to a dimming signal to perform dimming control of the at least one MJT LED.

According to an exemplary embodiment of the present disclosure, there is provided a backlight unit including: a printed circuit board including blocks; a backlight module including multi junction technology (MJT) light emitting diodes (LEDs) respectively disposed on the blocks; and a backlight control module configured to provide an operating voltage to the MJT LEDs within the backlight module, wherein each of the blocks includes at least one of the MJT LEDs, and the backlight control module is configured to independently control an operation of each of the MJT LEDs.

The backlight control module may include an operating power generator; and an operation controller.

The operating power generator may be configured to independently provide the operating voltage to each of the MJT LEDs within the backlight module, and the operation controller may be configured to perform a dimming control of at least one of the MJT LEDs by performing a pulse width modulation (PWM) control in response to a dimming signal of the backlight control module.

The operation controller may be configured to generate a dimming control signal of which a pulse width is modulated or a duty ratio is modulated.

The operation controller may be configured to independently detect and control an operating current of at least one of the MJT LEDs within the backlight module.

The operation controller may be configured to perform a dimming control of at least one of the MJT LEDs by controlling the operating current of at least one of the MJT LEDs in response to a dimming signal of the backlight control module.

An anode terminal of at least one of the MJT LEDs may be connected to the operating power generator, and a cathode terminal of at least one of the MJT LEDs may be connected to the operation controller.

The backlight unit may further include an optical member disposed on the MJT LEDs or the printed circuit board so as to correspond to the MJT LEDs.

The optical member may include a light incident face through which light emitted from the MJT LED enters and a light exit face through which the light exits at a wider light directivity angle than a light directivity angle of the MJT LEDs.

of the backlight unit may include optical members, and each of the optical members may be respectively disposed on one of the MJT LEDs.

The optical member may include a molded-resin on the MJT LEDs.

Each of the blocks may include one optical member.

Each of the blocks may have a horizontal length of 60 mm or less.

Each of the blocks may have a vertical length of 55 mm or less.

The blocks may include M×N blocks, and the blocks may constitute an M×N matrix arrangement.

At least one block of the blocks may include at least one of the MJT LEDs.

The MJT LEDs may be configured to include first to N-th light emitting cells (N is a natural number of 2 or greater), and the N-th light emitting cell may be electrically connected to an N−1-th light emitting cell in the same structure as the first light emitting cell and a second light emitting cell are electrically connected to each other.

The first to N-th light emitting cells may be connected to each other in series and are configured to be operated by an operating voltage of 2.5V to 4V, and the MJT LEDs may be configured to be operated by the operating voltage of at least 10V or greater.

The plurality of MJT LEDs may include: a first light emitting cell and a second light emitting cell disposed on a growth substrate to be spaced apart from each other, each of the first light emitting cell and the second light emitting cell including a lower semiconductor layer, an upper semiconductor layer disposed on the lower semiconductor layer, and an active layer disposed between the lower semiconductor layer and the upper semiconductor layer; a first transparent electrode layer disposed on the first light emitting cell and electrically connected to the first light emitting cell; an interconnection line electrically connecting the first light emitting cell and the second light emitting cell to each other; and an insulation layer spacing apart the interconnection line from a side surface of the first light emitting cell. The interconnection line has a first connection section for an electrical connection to the first light emitting cell, and a second connection section for an electrical connection to the second light emitting cell, one surface of the lower semiconductor layer may include an exposed region exposing the lower semiconductor layer, the first connection section may contact the first transparent electrode layer, and the second connection section may be electrically connected to the lower semiconductor layer of the second light emitting cell through the exposed region.

A portion of the first transparent electrode layer may be connected to the second light emitting cell.

The portion of the first transparent electrode layer may be disposed on the first light emitting cell, between the first light emitting cell and the second light emitting cell, and on a side surface of the lower semiconductor layer of the second light emitting cell.

A width of a portion of the first transparent electrode layer disposed on the side surface of the lower semiconductor layer of the second light emitting cell may be wider than a width of a portion of the interconnection line disposed on the side surface of the lower semiconductor layer of the second light emitting cell.

A width of a portion of the first transparent electrode layer disposed between the first light emitting cell and the second light emitting cell may be wider than a width of a portion of the interconnection line disposed between the first light emitting cell and the second light emitting cell.

The first transparent electrode layer may space apart the interconnection line from the insulation layer.

A portion of the insulation layer may be disposed on a portion of the growth substrate disposed between the first light emitting cell and the second light emitting cell.

The backlight unit may further include a current blocking layer disposed between the first light emitting cell and the first transparent electrode layer to space apart a portion of the first transparent electrode layer from the first light emitting cell.

The first transparent electrode layer may be disposed between the second connection section and the lower semiconductor layer of the second light emitting cell.

The backlight unit may further include a floodlighting plate disposed on the printed circuit board, wherein a distance between an upper surface of the printed circuit board and a lower surface of the floodlighting plate is 18 mm or more.

The operation controller may include a switch controller that electrically connects or insulates the MJT LEDs to and from each other.

The switch controller may connect the MJT LEDs in series and/or in parallel to each other.

The backlight module may include a phosphor and further includes a wavelength conversion layer covering the MJT LEDs, and light emitted from the MJT LEDs to penetrate through the wavelength conversion layer may have a National Television System Committee (NTSC) color reproduction ratio of 70% or greater.

As the number of light emitting cells within an MJT LED increases, an area of a block associated with the MJT LED may decrease.

According to another exemplary embodiment of the present disclosure, there is provided a backlight unit including: a printed circuit board including blocks; and a backlight module including multi junction technology (MJT) light emitting diodes (LEDs) disposed on the plurality of blocks; wherein the MJT LEDs include: a first light emitting cell and a second light emitting cell disposed on a growth substrate to be spaced apart from each other and each including a lower semiconductor layer, an upper semiconductor layer disposed on the lower semiconductor layer, and an active layer disposed between the lower semiconductor layer and the upper semiconductor layer; a first transparent electrode layer disposed on the first light emitting cell and electrically connected to the first light emitting cell; an interconnection line electrically connecting the first light emitting cell and the second light emitting cell to each other; and an insulation layer spacing apart the interconnection line from a side surface of the first light emitting cell. The interconnection line has a first connection section for an electrical connection to the first light emitting cell, and a second connection section for an electrical connection to the second light emitting cell, one surface of the lower semiconductor layer includes an exposed region exposing the lower semiconductor layer, the first connection section contacts the first transparent electrode layer, the second connection section is electrically connected to the lower semiconductor layer of the second light emitting cell through the exposed region, and an operation of each of the MJT LEDs is configured to be independently controlled.

A portion of the first transparent electrode layer may be connected to the second light emitting cell.

The portion of the first transparent electrode layer may be disposed on the first light emitting cell, between the first light emitting cell and the second light emitting cell, and on a side surface of the lower semiconductor layer of the second light emitting cell.

A width of a portion of the first transparent electrode layer disposed on the side surface of the lower semiconductor layer of the second light emitting cell may be wider than a width of a portion of the interconnection line disposed on the side surface of the lower semiconductor layer of the second light emitting cell.

A width of a portion of the first transparent electrode layer disposed between the first light emitting cell and the second light emitting cell may be wider than a width of a portion of the interconnection line disposed between the first light emitting cell and the second light emitting cell.

The first transparent electrode layer may space apart the interconnection line from the insulation layer.

A portion of the insulation layer may be disposed on a portion of the growth substrate disposed between the first light emitting cell and the second light emitting cell.

The backlight unit may further include a current blocking layer disposed between the first light emitting cell and the first transparent electrode layer to space apart a portion of the first transparent electrode layer from the first light emitting cell.

The first transparent electrode layer may be disposed between the second connection section and the lower semiconductor layer of the second light emitting cell.

According to embodiments of the present disclosure, the backlight module is fabricated using MJT LEDs having low current operation characteristics, thereby enabling low current operation of the backlight module and the backlight unit including the same.

In addition, according to the embodiments of the present disclosure, one connection section of the interconnection line electrically contacts a slanted side surface of light emitting cell, thereby increasing an effective light emitting area of each of light emitting cells in an MJT LED chip.

Further, according to the embodiments of the present disclosure, it is possible to enhance stability and reliability of drive circuits for controlling operation of the backlight module while reducing manufacturing costs.

Further, according to the embodiments of the present disclosure, the backlight unit has improved power efficiency and luminous efficacy, and can prevent a droop phenomenon due to operation at high current.

Further, according to the embodiments of the present disclosure, it is possible to minimize the number of LEDs constituting the backlight module and to allow individual operation of the MJT LEDs constituting the backlight module.

BRIEF DESCRIPTION OF THE DRAWINGS

The above and other aspects, features, and advantages of the present disclosure will become apparent from the detailed description of the following embodiments in conjunction with the accompanying drawings, in which:

FIG. 24A is a graph depicting illuminance distribution of an MJT LED, and FIG. 24B is a graph showing illuminance distribution of an MJT LED module using an optical member;

FIG. 25A is a graph depicting a light beam distribution of an MJT LED and FIG. 25B is a graph depicting a light beam distribution of an MJT LED module using an optical member;

DETAILED DESCRIPTION OF THE ILLUSTRATED EMBODIMENTS

Figure 1:
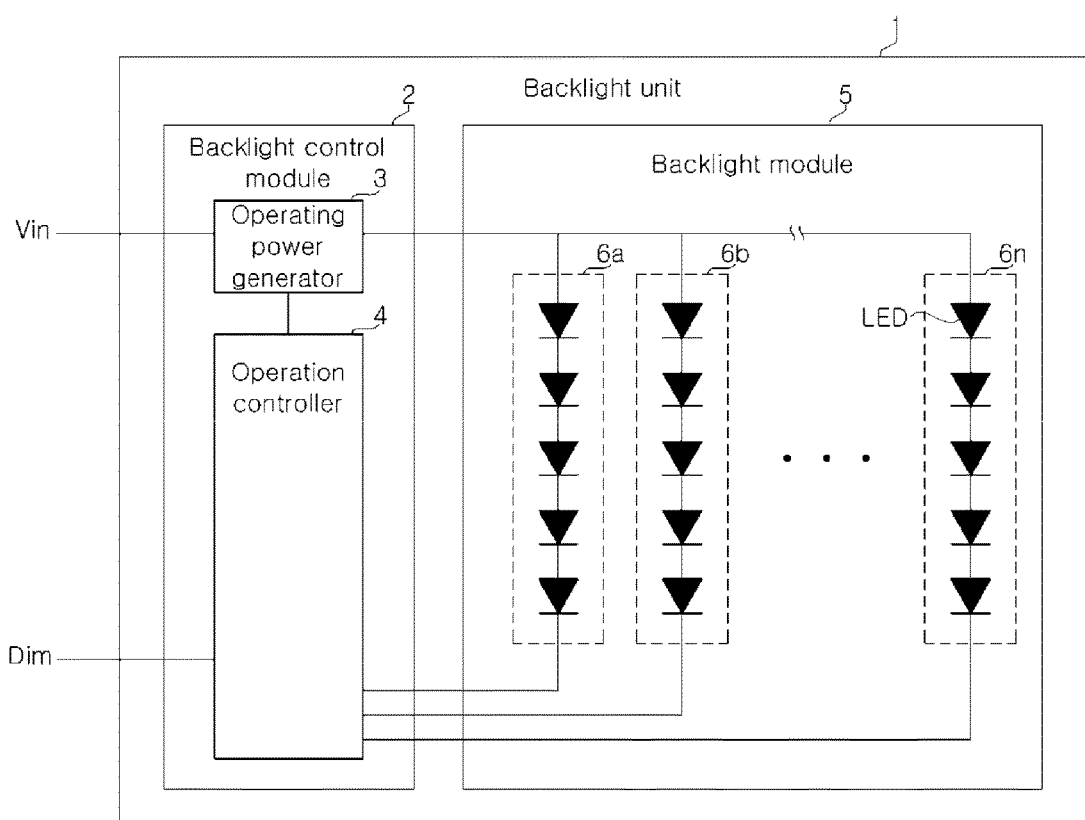
FIG. 1 is a configuration block diagram of a typical backlight unit including LEDs in the related art.

The present disclosure will be described more fully hereinafter with reference to the accompanying drawings, in which exemplary embodiments of the disclosure are illustrated. These embodiments will be described such that the disclosure can be easily understood by a person having ordinary knowledge in the art. Here, although various embodiments are disclosed herein, it should be understood that these embodiments are not intended to be exclusive. For example, individual structures, elements or features of a particular embodiment are not limited to that particular embodiment and can be applied to other embodiments without departing from the spirit and scope of the disclosure. In addition, it should be understood that locations or arrangement of individual components in each of the embodiments may be changed without departing from the spirit and scope of the present disclosure. Therefore, the following embodiments are not to be construed as limiting the disclosure, and the present disclosure should be limited only by the claims and equivalents thereof. Like components will be denoted by like reference numerals, and lengths, areas, thicknesses and shapes of the components are not drawn to scale throughout the accompanying drawings.

Now, exemplary embodiments of the disclosure will be described in detail with reference to the accompanying drawings so as to be easily realized by a person having ordinary knowledge in the art.

Exemplary Embodiment of the Present Disclosure

As used herein, the term "MJT LED chip" means a single LED chip, in which a plurality of light emitting cells is connected to each other via interconnection lines. The MJT LED chip may include N light emitting cells (N is an integer of 2 or more), in which N may be set in various ways as needed. Further, each of the light emitting cells may have a forward voltage in the range from 3V to 3.6V, but is not limited thereto. Accordingly, a forward voltage of a certain MJT LED chip (or MJT LED) is proportional to the number of light emitting cells included in the corresponding MJT LED chip. Since the number of light emitting cells included in the MJT LED chip may be set in various ways as needed, the MJT LED chip according to the present disclosure may be configured to have an operating voltage of 6V to 36V depending upon a specification of an operating power generator (for example, a DC converter) used in a backlight unit, but is not limited thereto. Further, operating current of the MJT LED chip is much smaller than a typical single-cell LED, and may range, for example, from 20 mA to 40 mA, without being limited thereto.

In addition, the term "MJT LED" refers to a light emitting device or an LED package, on which the MJT LED chip according to the present disclosure is mounted.

Further, the term "MJT LED module" refers to a component in which a single MJT LED and a single optical member corresponding to the MJT LED are coupled to each other. The corresponding optical member may be directly placed on the MJT LED, or may be placed on a printed circuit board on which the MJT LED is mounted. Regardless of displacement of the optical member, the case wherein a single MJT LED and a single optical member corresponding thereto are coupled to each other will be referred to as the MJT LED module.

Further, the term "backlight module" means a lighting module, in which a plurality of MJT LEDs is disposed on a printed circuit board and optical members are provided corresponding to the respective MJT LEDs. Thus, the term "backlight module" may mean a lighting module in which plural MJT LED modules are mounted on a printed circuit board in a predetermined manner. In one aspect, a backlight module according to one exemplary embodiment of the disclosure may be a direct type backlight module. However, it should be understood that the present disclosure is not limited thereto. In other embodiments, the backlight module according to the present disclosure may be used as a light source for surface lighting. Accordingly, it will be apparent to those skilled in the art that any component including the subject matter of the backlight module according to the present disclosure falls within the scope of the present disclosure, despite the name of the component.

Overview of Backlight Unit Using MJT LEDs

Before detailed descriptions of the backlight unit according to the present disclosure are given, several technical features of the present disclosure will be described. The present disclosure is based on characteristics of an MJT LED in order to solve the aforementioned problems in the related art. That is, in order to solve the problems due to low voltage and high current operation characteristics of a typical single-cell LED in the related art, the present disclosure has been created based on high voltage and low current operation characteristics of the MJT LED (for example, an operating voltage of 6 V to 36 V and an operating current of 20 mA to 40 mA), and provides a backlight module using such an MJT LED. As described above, unlike a typical single-cell LED, the MJT LED may include any number of light emitting cells and may have various forward voltages depending upon the number of light emitting cells included therein. In addition, since the MJT LED includes a plurality of light emitting cells, it is possible to illuminate a wider area than the typical single-cell LED, and since the MJT LED is constituted by a single MJT LED chip, design and application of an optical member therefor can be easily achieved. Thus, when using such an MJT LED, one divided area among a plurality of divided areas in a liquid crystal panel can be covered by one MJT LED module (that is, one MJT LED and one optical member). As a result, the number of LEDs required for the backlight module is reduced as compared with the typical single-cell LED. Consequently, according to the present disclosure, a plurality of MJT LED modules is used to constitute a backlight module and a backlight unit is configured to allow independent control of each of the MJT LEDs constituting the backlight module, thereby achieving the above and other objects of the present disclosure.

Now, referring to FIG. 2 through FIG. 4 and FIG. 43, a backlight unit 1000 according to one exemplary embodiment of the disclosure will be described in more detail.

Figure 2:
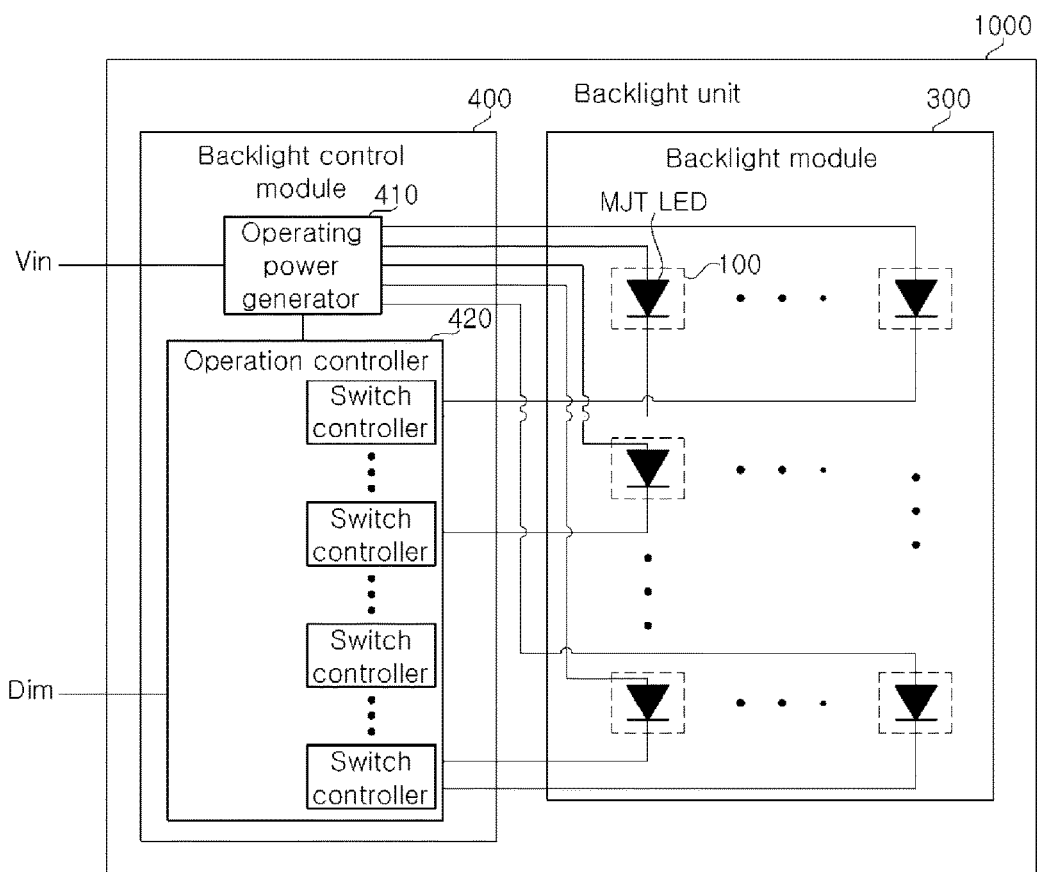
FIG. 2 is a schematic block diagram of a backlight unit employing MJT LEDs according to one exemplary embodiment of the present disclosure.

First, FIG. 2 is a schematic block diagram of a backlight unit employing MJT LEDs according to one exemplary embodiment of the present disclosure. Referring to FIG. 2, the backlight unit 1000 according to this embodiment includes a backlight control module 400 and a backlight module 300. Further, the backlight units illustrated in the present disclosure may further include a floodlighting plate (not shown).

More specifically, the backlight control module 400 according to this disclosure includes an operating power generator 410, which generates/outputs DC power based on input voltage Vin input from an external power source, and an operation controller 420 controlling operation of each of a plurality of MJT LEDs 100 constituting the backlight module 300 (on/off control and dimming control). The operating power generator 410 generally generates stable DC voltage such as 12V, 24V, 48V, and the like, as operating power and supplies the DC voltage to the plurality of MJT LEDs 100 constituting the backlight module 300. Here, the input voltage Vin supplied to the operating power generator 410 may be a commercially available alternating voltage of 220V or 110V. The operating power generator 410 may have substantially the same configuration as the typical operating power generator 410 as shown in FIG. 1.

The backlight module 300 according to this disclosure may include a plurality of MJT LEDs 100 and optical members (not shown in FIG. 2) corresponding to the respective MJT LEDs 100 and disposed in a regular arrangement (for example, in a matrix arrangement) on a printed circuit board (not shown in FIG. 2).

Figure 43A:
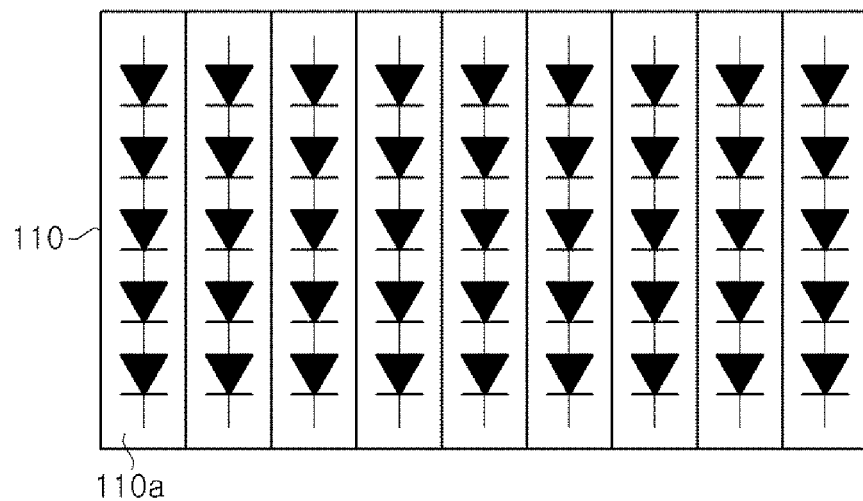
FIG. 43A and FIG. 43B are schematic views comparing a backlight unit (FIG. 43A) in the related art with a backlight unit (FIG. 43B) according to one exemplary embodiment of the present disclosure.
Figure 43B:
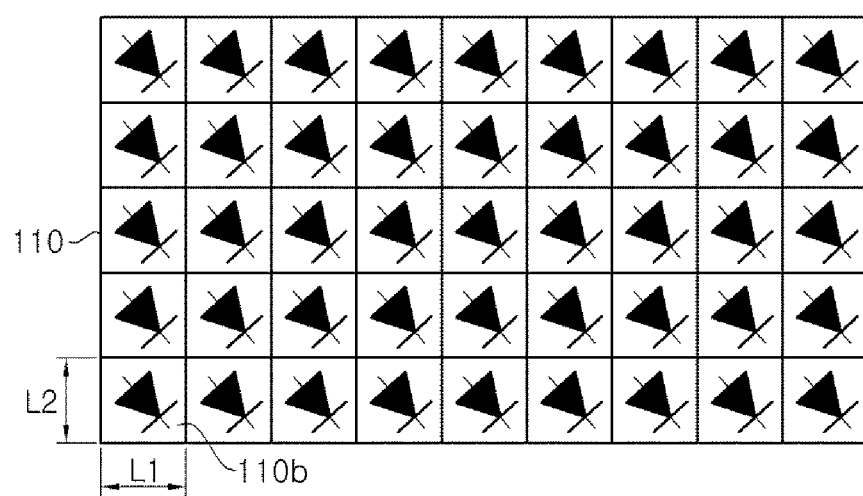

FIG. 43B is a schematic view illustrating a configuration of the backlight unit according to the present disclosure. Referring to FIG. 43B, the printed circuit board 110 may include a plurality of blocks 110b. The block 110b refers to a partial area of the printed circuit board 110 including an area on which at least one of the plurality of MJT LEDs are mounted, upon mounting the plurality of MJT LEDs on the printed circuit board 110. Specifically, one block 110b may include at least one MJT LED. In an example, one block 110b may include only one MJT LED. However, the present disclosure is not limited thereto, but one block 110b may include a plurality of MJT LEDs.

M blocks 110b are disposed in a horizontal direction and N blocks 110b are disposed in a vertical direction to form an M×N matrix arrangement. As shown FIG. 43B, for example, 45 blocks 110b may constitute a 9×5 matrix arrangement. A horizontal length L1 of each of the blocks 110b may be 60 mm or less. In addition, a vertical length L2 of each of the blocks 110b may be 55 mm or less.

In the exemplary embodiment shown in FIG. 2, it is assumed that M MJT LEDs 100 are disposed in a longitudinal direction and N MJT LEDs 100 are disposed in a transverse direction to form an M×N matrix arrangement within the backlight module 300. In this case, the respective MJT LEDs may be disposed such that one MJT LED corresponds to one of the blocks ("one-to-one mapping configuration"). In addition, an MJT LED placed at a left side uppermost portion of the backlight module will be referred to as a 1-1st MJT LED (100_11) and an MJT LED placed at a right side lowermost portion thereof will be referred to as an M-Nth MJT LED (100_MN).

Here, it should be noted that, unlike the related art shown in FIG. 1, the MJT LEDs 100 within the backlight module 300 according to the embodiment of FIG. 2 are independently connected to the operating power generator 410 and the operation controller 420 instead of being connected to each other in series, in parallel, or in series/parallel. That is, in the embodiment shown in FIG. 2, an anode terminal of each MJT LED 100 is independently connected to the operating power generator 410 and a cathode terminal of each MJT LED 100 is independently connected to the operation controller 420. When the respective MJT LEDs and the respective blocks correspond to each other with the one-to-one mapping configuration, the blocks may be configured to be independently connected to the operating power generator 410 and the operating controller 420.

With this configuration, the operation controller 420 according to this disclosure may independently control operation of each of the plurality of MJT LEDs 100 constituting the backlight module 300. More specifically, the operation controller 420 according to this disclosure may control a dimming level of a specific MJT LED among the plurality of MJT LEDs 100 in response to a dimming signal (Dim). When the respective MJT LEDs and the respective blocks correspond to each other with the one-to-one mapping configuration, the operating controller 420 may independently control an operation of each of the plurality of blocks.

In one embodiment, the operation controller 420 according to the present disclosure includes a PWM (Pulse Width Modulation) controller (not shown) and may perform dimming control through pulse width modulation control with respect to operating power supplied to a specific MJT LED, which is a dimming control target, among the MJT LEDs 100. Particularly, unlike the typical backlight unit in the related art as shown in FIG. 1, the backlight unit 1000 according to the present disclosure as shown in FIG. 2 includes the plurality of MJT LEDs 100, each of which is connected to the operating power generator 410 to independently receive operating power, thereby enabling dimming control in such a pulse width modulation manner. Specifically, the operating controller 420 may control a duty ratio of operating power in the range of 0% to 100%. For example, when there is a need for dimming control of the 1-1st MJT LED (100_11), the operation controller 420 performs pulse width modulation of the generated operating power at a predetermined duty ratio (for example, 60%) in response to a dimming signal (Dim), and supplies the modified operating power to the 1-1st MJT LED (100_11) to perform dimming control of the 1-1st MJT LED (100_11). At this time, operating power, which is not subjected to pulse width modulation and has a duty ratio of 100%, will be supplied to other MJT LEDs except for the 1-1st MJT LED (100_11). Alternatively, operating power, which is subjected to pulse width modulation at a normal duty ratio (a duty ratio of, for example, 80% when no separate dimming control is provided), is provided to the other MJT LEDs except for the 1-1st MJT LED (100_11). Consequently, the backlight unit 1000 according to the present disclosure allows local dimming with respect to only the 1-1st MJT LED (100_11). Of course, it will be apparent to those skilled in the art that it is possible to perform simultaneous dimming control with respect to the plurality of MJT LEDs at the same dimming level and/or at different dimming levels for the respective MJT LEDs through PWM control. The operating power described above may be a DC operating voltage. The PWM controller for PWM control of the operating power is well known in the art, and thus, a detailed description thereof will be omitted.

In another embodiment, the operation controller 420 according to the present disclosure includes an operating current detector (not shown) and an operating current controller (not shown), and may perform dimming control by controlling the operating current supplied to a specific MJT LED, which is a dimming control target, among the MJT LEDs 100. Particularly, unlike the typical backlight unit shown in FIG. 1, in the backlight unit 1000 according to the present disclosure shown in FIG. 2, each of the plural MJT LEDs 100 is independently connected to the operation controller 420, thereby enabling dimming control by control of the operating current of each of the MJT LEDs. Here, the operating current detector and the operating current controller included in the operation controller 420 correspond one to one to each of the MJT LEDs 100. Accordingly, when the backlight module 300 is composed of M×N MJT LEDs 100 as described above, the operation controller 420 includes M×N operating current detectors and M×N operating current controllers. For example, when there is a need for dimming control with respect to an M-Nth MJT LED (100_MN), the operation controller 420 detects operating current flowing through the M-Nth MJT LED (100_MN) using the operating current detector, and changes the operating current flowing through the M-Nth MJT LED (100_MN) (for example, to 100% of a maximum operating current) in response to a dimming signal (Dim), thereby performing dimming control with respect to the M-Nth MJT LED (100_MN). For example, the operating controller 420 may control the operation current in the range of 0% to 100%. Here, since normal operating current (a preset standard operating current, for example, 80% of the maximum operating current, when there is no separate dimming control) flows through other MJT LEDs except for the M-Nth MJT LED (100_MN), local dimming can be performed with respect only to the M-Nth MJT LED (100_MN). It will be apparent to those skilled in the art that dimming control of the plurality of MJT LEDs can be performed to the same dimming level through simultaneous control of the operating current with respect to the plurality of MJT LEDs and/or to different dimming levels for the respective MJT LEDs. In such an embodiment, since there is no need for independent supply of operating power to the MJT LEDs 100, the anode terminal of each of the MJT LEDs 100 may be connected in parallel to one operating power line connected to the operating power generator 410, unlike the embodiment shown in FIG. 2. The operating current detector and the operating current controller are well known in the art and detailed descriptions thereof will thus be omitted.

The operating controller 420 according to the present disclosure may include a plurality of switch controllers (not shown). The switch controllers may be each disposed between the plurality of MJT LEDs. Specifically, the switch controllers may be disposed between one MJT LED and an adjacent MJT LED. More specifically, the switch controllers may be disposed between one MJT LED and the remaining MJT LEDs. That is, the switch controllers may be disposed between one MJT LED of M×N MJT LEDs and the remaining M×N−1 MJT LEDs, which may correspond to all MJT LED included in the backlight module 300 as well as one MJT LED.

The respective switch controllers may electrically connect two MJT LEDs connected by the switch controller, and may also electrically insulate the two MJT LEDs according to a switching operation. Thus, a plurality of MJT LEDs may be connected to each other in series and/or in parallel through the switch controllers. Consequently, a desired structure of the backlight module 300 may be easily implemented.

The backlight unit according to the present disclosure may further include a floodlighting plate (not shown). The floodlighting plate may be disposed over the backlight module 300. Specifically, the floodlighting plate may be disposed over the printed circuit board 110 of the backlight module 300. The floodlighting plate may serve to diffuse light emitted from the MJT LEDs of the backlight module 300. A distance between a lower surface of the floodlighting plate and an upper surface of the printed circuit board may be 18 mm or more.

Overview of MJT LED and MJT LED Module

Figure 3:
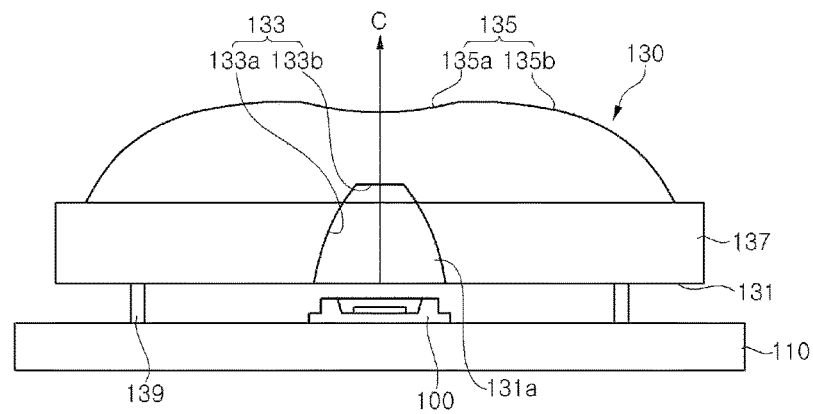
FIG. 3 is a schematic sectional view of an MJT LED module according to one exemplary embodiment of the present disclosure.
Figure 4:
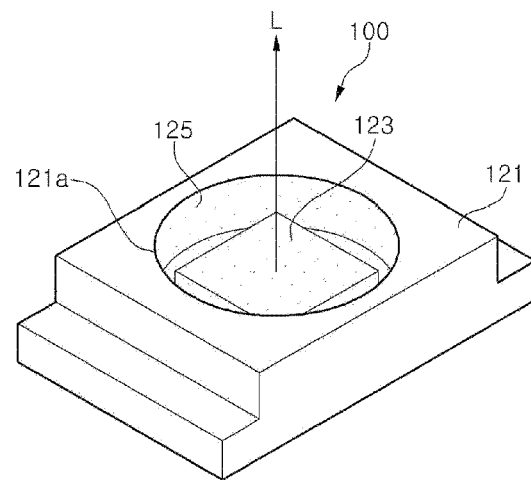
FIG. 4 is a schematic perspective view of the MJT LED according to the one exemplary embodiment of the present disclosure.

FIG. 3 is a schematic sectional view of an MJT LED module according to one exemplary embodiment of the present disclosure, and FIG. 4 is a schematic perspective view of the MJT LED according to the one exemplary embodiment of the present disclosure. Now, detailed configurations of an MJT LED 100 and an MJT LED module according to embodiments of the present disclosure will be described with reference to FIG. 3 and FIG. 4.

Referring to FIG. 3, the MJT LED module includes an MJT LED 100 and an optical member 130. When the MJT LED 100 is mounted on a printed circuit board 110, the corresponding optical member 130 is mounted on the printed circuit board 110 at a place corresponding to the position of the MJT LED 100. For example, each block of the printed circuit board 110 may include one optical member. As described above, in other embodiments, the optical member 130 may be directly connected to the MJT LED 100. More specifically, the optical member 130 may be formed by molding a resin on the MJT LED. Although the printed circuit board 110 is partially shown in FIG. 3, a plurality of MJT LEDs 100 and the optical members 130 corresponding thereto are disposed on a single printed circuit board 110 in various arrangements such as a matrix arrangement or a honeycomb arrangement to form the backlight module 300 as described above.

The printed circuit board 110 is formed on an upper surface thereof with conductive land patterns to which terminals of the MJT LED 100 are bonded. Further, on the printed circuit board 110 may include a reflective layer on the upper surface thereof. The printed circuit board 110 may be a MCPCB (Metal-Core PCB) based on a metal having good thermal conductivity. Alternatively, the printed circuit board 110 may be formed of an insulating substrate material such as FR4. Although not shown, the printed circuit board 110 may be provided at a lower side thereof with a heat sink to dissipate heat from the MJT LED 100.

As clearly shown in FIG. 4, the MJT LED 100 may include a housing 121, an MJT LED chip 123 mounted on the housing 121, and a wavelength conversion layer 125 covering the MJT LED chip 123. The MJT LED 100 further includes lead terminals (not shown) supported by the housing 121.

The housing 121 forms a package body and may be formed by injection molding of a plastic resin such as PA, PPA, and the like. In this case, the housing 121 may be formed in a state of supporting the lead terminals by an injection molding process, and may have a cavity 121*a* for mounting the MJT LED chip 123 therein. The cavity 121*a* defines a light exit area of the MJT LED 100.

The lead terminals are separated from each other within the housing 121 and extend outside of the housing 121 to be bonded to the land patterns on the printed circuit board 110.

The MJT LED chip 123 is mounted on the bottom of the cavity 121*a* and electrically connected to the lead terminals. The MJT LED chip 123 may be a gallium nitride-based MJT LED which emits UV light or blue light. A detailed configuration of the MJT LED chip 123 according to the present disclosure and a method of manufacturing the same will be described below with reference to FIG. 5 to FIG. 18.

The wavelength conversion layer 125 covers the MJT LED chip 123. In one embodiment, the wavelength conversion layer 125 may be formed by filling the cavity 121*a* with a molding resin containing phosphors after mounting the MJT LED chip 123 in the cavity 121*a*. At this time, the wavelength conversion layer 125 may fill the cavity 121*a* of the housing 121 and have a substantially flat or convex upper surface. Further, a molding resin having a shape of the optical member may be formed on the wavelength conversion layer 125.

In another embodiment, the MJT LED chip 123, which has a coating layer of the phosphors formed by conformal coating, may be mounted on the housing 121. Specifically, the coating layer of the phosphors may be formed on the MJT LED chip 123 by conformal coating and the MJT LED chip 123 having the conformal coating layer may be mounted on the housing 121. The MJT LED chip 123 having the conformal coating layer may be molded with a transparent resin. In addition, the molding resin may have the shape of the optical member and thus may act as a primary optical member.

The wavelength conversion layer 125 converts-wavelengths of light emitted from the MJT LED chip 123 to provide light of mixed colors, for example, white light.

The wavelength conversion layer 125 may include KSF-based and/or UCD-based phosphors. Thus, light emitted from the MJT LED chip 123 to penetrate through the wavelength conversion layer 125 may have an NTSC color reproduction ratio of 70% or more.

The MJT LED 100 is designed to have a light beam distribution of a mirror symmetry structure, particularly, a light beam distribution of a rotational symmetry structure. At this time, an axis of the MJT LED directed towards the center of the light beam distribution is defined as an optical axis L. That is, the MJT LED 100 is designed to have a light beam distribution which is bilaterally symmetrical with respect to the optical axis L. Generally, the cavity 121*a* of the housing 121 may have a mirror symmetry structure, and the optical axis L may be defined as a straight line passing through the center of the cavity 121*a*.

The optical member 130 includes a light incident face through which light emitted from the MJT LED 100 enters the optical member and a light exit face through which the light exits the optical member at a wider light beam distribution than that of the MJT LED 100, thereby enabling uniform distribution of the light emitted from MJT LED 100. The optical member 130 according to the present disclosure will be described below with reference to FIG. 19A to FIG. 33B.

Configuration of MJT LED Chip and Method of Manufacturing the Same

Next, the configuration of the MJT LED chip 123 mounted on the MJT LED according to the present disclosure and a method of manufacturing the same will be described in more detail with reference to FIG. 5 to FIG. 18.

Figure 5:
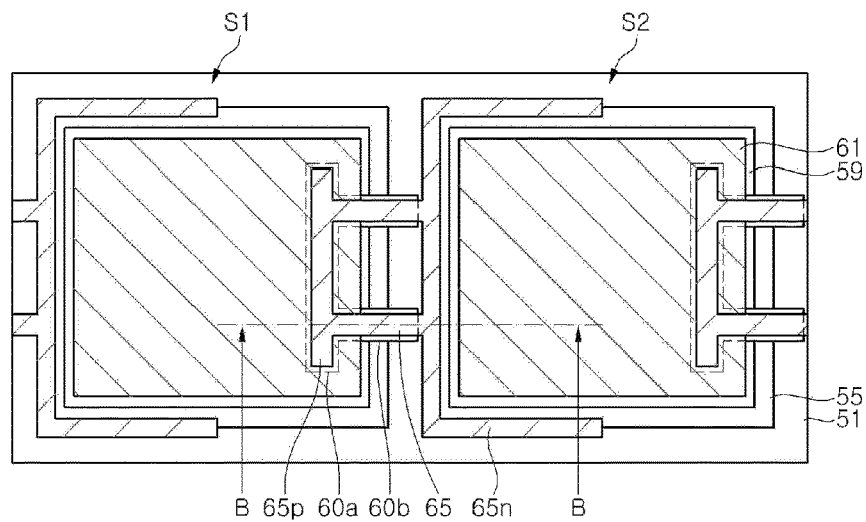
FIG. 5 is a schematic plan view of an MJT LED chip according to one exemplary embodiment of the present disclosure.
Figure 6:
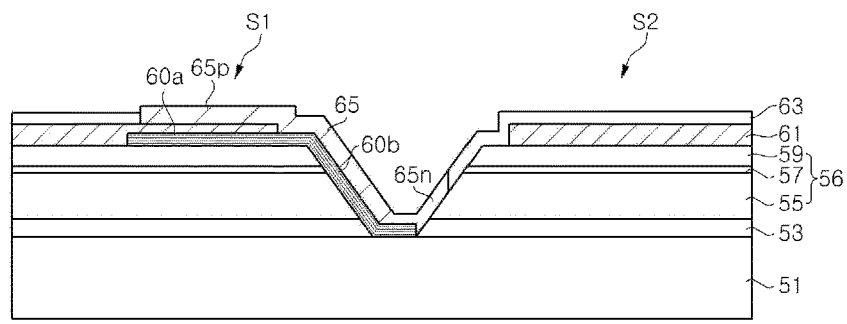
FIG. 6 is a schematic sectional view of the MJT LED chip taken along line B-B of FIG. 5.

FIG. 5 is a schematic plan view of an MJT LED chip according to one exemplary embodiment of the present disclosure, and FIG. 6 is a schematic sectional view of the MJT LED chip taken along line B-B of FIG. 5.

Referring to FIG. 5 and FIG. 6, the MJT LED chip 123 includes a growth substrate 51, light emitting cells S1, S2, a transparent electrode layer 61, a current blocking layer 60a, an insulation layer 60b, an insulation protective layer 63, and an interconnection line 65. Further, the MJT LED chip 123 may include a buffer layer 53.

The growth substrate 51 may be an insulation or conductive substrate, and may include, for example, a sapphire substrate, a gallium nitride substrate, a silicon carbide (SiC) substrate, or a silicon substrate. In addition, the growth substrate 51 may have a convex-concave pattern (not shown) on an upper surface thereof as in a patterned sapphire substrate.

A first light emitting cell S1 and a second light emitting cell S2 are separated from each other on a single growth substrate 51. Each of the first and second light emitting cells S1, S2 has a stack structure 56, which includes a lower semiconductor layer 55, an upper semiconductor layer 59 placed on a region of the lower semiconductor layer, and an active layer 57 interposed between the lower semiconductor layer and the upper semiconductor layer. Here, the upper and lower semiconductor layers may be an n-type semiconductor layer and a p-type semiconductor layer, respectively, or vice versa.

Each of the lower semiconductor layer 55, the active layer 57 and the upper semiconductor layer 59 may be formed of a gallium nitride-based semiconductor material, that is, (Al, In, Ga)N. The compositional elements and ratio of the active layer 57 are determined depending upon desired wavelengths of light, for example, UV light or blue light, and the lower semiconductor layer 55 and the upper semiconductor layer 59 are formed of a material having a greater band gap than the active layer 57.

The lower semiconductor layer 55 and/or the upper semiconductor layer 59 may have a single layer structure, as shown in FIG. 5. Alternatively, these semiconductor layers may have a multilayer structure. Further, the active layer 57 may have a single quantum-well structure or a multi-quantum well structure.

Each of the first and second light emitting cells S1, S2 may have a slanted side surface, an inclination of which may range, for example, from 15° to 80° relative to an upper surface of the growth substrate 51.

The active layer 57 and the upper semiconductor layer 59 are placed on the lower semiconductor layer 55. An upper surface of the lower semiconductor layer 55 may be completely covered by the active layer 57 such that only a side surface thereof is exposed.

Although portions of the first light emitting cell S1 and the second light emitting cell S2 are shown in FIG. 6, the first and second light emitting cells S1, S2 may have a similar or the same structure as that shown in FIG. 5. That is, the first light emitting cell S1 and the second light emitting cell S2 may have the same gallium nitride-based semiconductor stack structure, and may have slanted side surfaces of the same structure.

The buffer layer 53 may be interposed between the light emitting cells S1, S2 and the growth substrate 51. The buffer layer 53 relieves lattice mismatch between the growth substrate 51 and the lower semiconductor layer 55 formed thereon.

The transparent electrode layer 61 is placed on each of the light emitting cells S1, S2. That is, a first transparent electrode layer 61 is placed on the first light emitting cell S1 and a second transparent electrode layer 61 is placed on the second light emitting cell S2. The transparent electrode layer 61 may be placed on the upper semiconductor layer 59 to be connected to the upper semiconductor layer 59, and may have a narrower area than the upper semiconductor layer 59. That is, the transparent electrode layer 61 may be recessed from an edge of the upper semiconductor layer 59. With this structure, it is possible to prevent current crowding at the edge of the transparent electrode layer 61 through the side surfaces of the light emitting cells S1, S2.

In another aspect, the current blocking layer 60a may be placed on each of the light emitting cells S1, S2. That is, the current blocking layer 60a is placed between the transparent electrode layer 61 and each of the light emitting cells S1, S2. Part of the transparent electrode layer 61 is placed on the current blocking layer 60a. The current blocking layer 60a may be placed near an edge of each of the light emitting cells S1, S2, but is not limited thereto. Alternatively, the current blocking layer 60a may be placed in a central region of each of the light emitting cells S1, S2. The current blocking layer 60a is formed of an insulation material and, particularly, may include a distributed Bragg reflector in which layers having different indices of refraction are alternately stacked one above another.

The insulation layer 60b covers a portion of the side surface of the first light emitting cell S1. As shown in FIG. 5 and FIG. 6, the insulation layer 60b may extend to a region between the first light emitting cell S1 and the second light emitting cell S2, and may cover a portion of a side surface of the lower semiconductor layer 55 of the second light emitting cell S2. The insulation layer 60b may have the same structure and the same material as those of the current blocking layer 60a, and may include a distributed Bragg reflector, without being limited thereto. The insulation layer 60b may be formed of a different material than that of the current blocking layer 60a by a different process. Here, when the insulation layer 60b is a distributed Bragg reflector formed by stacking multiple layers, it is possible to efficiently suppress generation of defects such as pinholes in the insulation layer 60b. The insulation layer 60b may be connected to the current blocking layer 60a to form continuous layers, but is not limited thereto. In other embodiments, the insulation layer 60b may be separated from the current blocking layer 60a.

The interconnection line 65 electrically connects the first light emitting cell S1 to the second light emitting cell S2. The interconnection line 65 includes a first connection section 65p and a second connection section 65n. The first connection section 65p is electrically connected to the transparent electrode layer 61 on the first light emitting cell S1, and the second connection section 65n is electrically connected to the lower semiconductor layer 55 of the second light emitting cell S2. The first connection section 65*p* may be placed near one edge of the first light emitting cell S1, but is not limited thereto. In other embodiments, the first connection section 65*p* may be placed in the central region of the first light emitting cell S1.

The second connection section 65*n* may contact the slanted side surface of the second light emitting cell S2, particularly, the slanted side surface of the lower semiconductor layer 55 of the second light emitting cell S2. Further, as shown in FIG. 5, the second connection section 65*n* may electrically contact the slanted side surface of the lower semiconductor layer 55 while extending to both sides along the circumference of the second light emitting cell S2. The first light emitting cell S1 is connected to the second light emitting cell S2 in series by the first and second connection sections 65*p*, 65*n* of the interconnection line 65.

The interconnection line 65 may contact the transparent electrode layer 61 over an overlapping region with the transparent electrode layer 61. In the related art, a portion of the insulation layer is placed between the transparent electrode layer and the interconnection line. On the contrary, according to the present disclosure, the interconnection line 65 may directly contact the transparent electrode layer 61 without any insulation material interposed therebetween.

Further, the current blocking layer 60*a* may be placed over the overlapping region between the interconnection line 65 and the transparent electrode layer 61, and the current blocking layer 60*a* and the insulation layer 60*b* may be placed over an overlapping region between the interconnection line 65 and the first light emitting cell S1. Further, the insulation layer 60*b* may be placed between the second light emitting cell S2 and the interconnection line 65 in other regions excluding a connection region between the interconnection line 65 and the second light emitting cell S2.

In FIG. 5, the first connection section 65*p* and the second connection section 65*n* of the interconnection line 65 are connected to each other through two paths. However, it should be understood that the first and second connection sections may be connected to each other via a single path.

When the current blocking layer 60*a* and the insulation layer 60*b* have reflective characteristics like the distributed Bragg reflector, the current blocking layer 60*a* and the insulation layer 60*b* are preferably placed substantially in the same region as the region for the interconnection line 65 within a region having an area of two times or less the area of the interconnection line 65. The current blocking layer 60*a* and the insulation layer 60*b* block light emitted from the active layer 57 from being absorbed into the interconnection line 65. However, when occupying an excessively large area, the current blocking layer 60*a* and the insulation layer 60*b* can block emission of light to the outside. Thus, there is a need for restriction of the area thereof.

The insulation protective layer 63 may be placed outside the region of the interconnection line 65. The insulation protective layer 63 covers the first and second light emitting cells S1, S2 outside the region of the interconnection line 65. The insulation protective layer 63 may be formed of silicon oxide ($SiO_2$) or silicon nitride. The insulation protective layer 63 has an opening through which the transparent electrode layer 61 on the first light emitting cell S1 and the lower semiconductor layer of the second light emitting cell S2 are exposed, and the interconnection line 65 may be placed within the opening.

A side surface of the insulation protective layer 63 and a side surface of the interconnection line 65 may face each other, and may contact each other. Alternatively, the side surface of the insulation protective layer 63 and the side surface of the interconnection line 65 may be separated from each other while facing each other.

According to the present embodiment, since the second connection section 65*n* of the interconnection line 65 electrically contacts the slanted side surface of the second light emitting cell S2, there is no need to expose the upper surface of the lower semiconductor layer 55 of the second light emitting cell S2. Accordingly, there is no need for partial removal of the second semiconductor layer 59 and the active layer 57, thereby increasing an effective light emitting area of the MJT LED chip 123.

In addition, the current blocking layer 60*a* and the insulation layer 60*b* may be formed of the same material and have the same structure, and thus may be formed at the same time by the same process. Further, since the interconnection line 65 is placed within the opening of the insulation protective layer 63, the insulation protective layer 63 and the interconnection line 65 may be formed using the same mask pattern.

Although two light emitting cells including the first light emitting cell S1 and the second light emitting cell S2 are illustrated in this embodiment, it should be understood that the present disclosure is not limited thereto. That is, a greater number of light emitting cells may be electrically connected to each other via the interconnection lines 65. For example, the interconnection lines 65 may electrically connect the lower semiconductor layers 55 and the transparent electrode layers 61 of adjacent light emitting cells to each other to form a series array of light emitting cells. A plurality of such arrays may be formed and connected in inverse-parallel to each other to be operated by an AC power source connected thereto. In addition, a bridge rectifier (not shown) may be connected to the series array of light emitting cells to allow the light emitting cells to be operated by the AC power source. The bridge rectifier may be formed by bridging the light emitting cells having the same structure as that of the light emitting cells S1, S2 using the interconnection lines 65.

FIG. 7 to FIG. 13 are schematic sectional views illustrating a method of fabricating an MJT LED chip according to one exemplary embodiment of the present disclosure.

Figure 7:
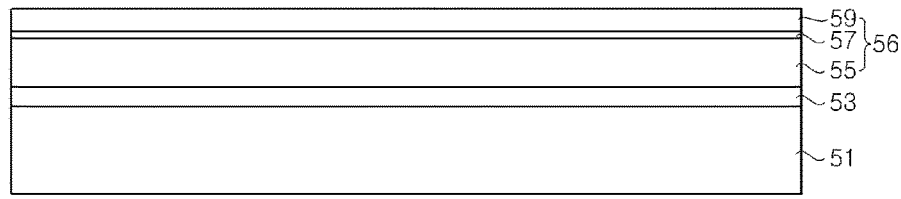
FIG. 7 to FIG. 13 are schematic sectional views illustrating a method of fabricating an MJT LED chip according to one exemplary embodiment of the present disclosure.

Referring to FIG. 7, a semiconductor stack structure 56 including a lower semiconductor layer 55, an active layer 57 and an upper semiconductor layer 59 is formed on a growth substrate 51. In addition, a buffer layer 53 may be formed on the growth substrate 51 before formation of the lower semiconductor layer 55.

The growth substrate 51 may be formed of a material selected from among sapphire ($Al_2O_3$), silicon carbide (SiC), zinc oxide (ZnO), silicon (Si), gallium arsenic (GaAs), gallium phosphide (GaP), lithium alumina ($LiAl_2O_3$), boron nitride (BN), aluminum nitride (AlN), and gallium nitride (GaN), without being limited thereto. That is, the material for the growth substrate 51 may be selected in various ways depending upon materials of semiconductor layers to be formed on the growth substrate 51. Further, the growth substrate 51 may have a convex-concave pattern on an upper surface thereof as in a patterned sapphire substrate.

The buffer layer 53 is formed to relieve lattice mismatch between the growth substrate 51 and the semiconductor layer 55 formed thereon, and may be formed of, for example, gallium nitride (GaN) or aluminum nitride (AlN). When the growth substrate 51 is a conductive substrate, the buffer layer 53 is preferably formed of an insulation layer or a semi-insulating layer. For example, the buffer layer 53 may be formed of AlN or semi-insulating GaN.

Each of the lower semiconductor layer 55, the active layer 57 and the upper semiconductor layer 59 may be formed of a gallium nitride-based semiconductor material, for example, (Al, In, Ga)N. The lower and upper semiconductor layers 55, 59 and the active layer 57 may be intermittently or continuously formed by metal organic chemical vapor deposition (MOCVD), molecular beam epitaxy, hydride vapor phase epitaxy (HVPE), and the like.

Here, the lower and upper semiconductor layers may be n-type and p-type semiconductor layers, or vice versa. Among the gallium nitride-based compound semiconductor layers, an n-type semiconductor layer may be formed by doping an n-type impurity, for example, silicon (Si), and a p-type semiconductor layer may be formed by doping a p-type impurity, for example, magnesium (Mg).

Figure 8:
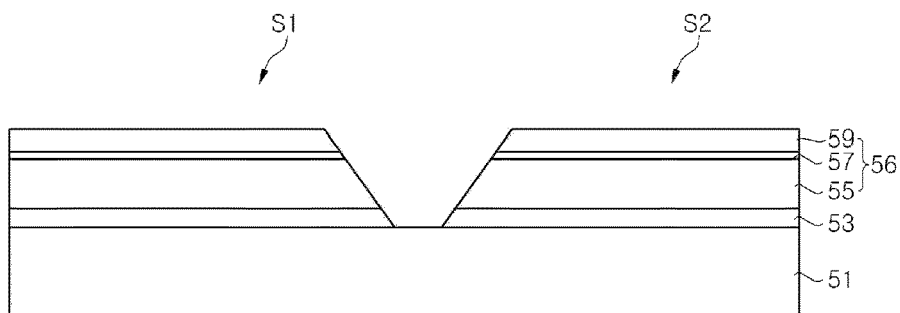

Referring to FIG. 8, a plurality of light emitting cells S1, S2 separated from each other is formed by a photolithography and etching process. Each of the light emitting cells S1, S2 is formed to have a slanted side surface. In a typical method of manufacturing an MJT LED chip, an additional photolithography and etching process is performed to partially expose an upper surface of the lower semiconductor layer 55 of each of the light emitting cells S1, S2. However, in this embodiment, the photolithography and etching process performed to partially expose the upper surface of the lower semiconductor layer 55 is omitted.

Figure 9:
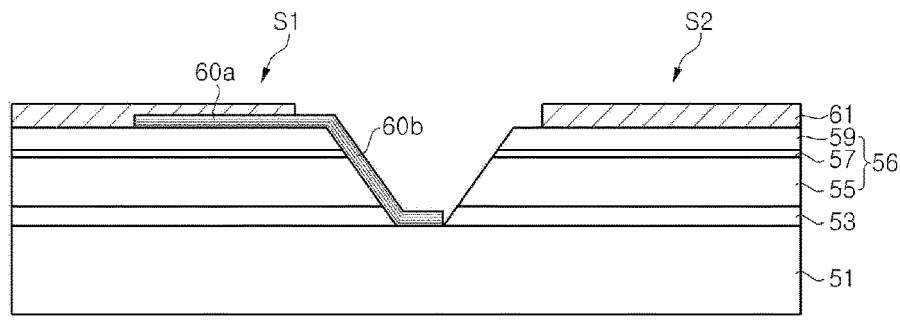

Referring to FIG. 9, a current blocking layer 60a covering some region on the first light emitting cell S1 and an insulation layer 60b partially covering the side surface of the first light emitting cell S1 are formed. The insulation layer 60b may extend to cover a region between the first light emitting cell S1 and the second light emitting cell S2 while partially covering a side surface of the lower semiconductor layer 55 of the second light emitting cell S2.

The current blocking layer 60a and the insulation layer 60b may be formed by depositing an insulation material layer, followed by patterning through photolithography and etching. Alternatively, the current blocking layer 60a and the insulation layer 60b may be formed of an insulation material layer by a lift-off technique. Particularly, each of the current blocking layer 60a and the insulation layer 60b may be a distributed Bragg reflector formed by alternately stacking layers having different indices of refraction, for example, $SiO_2$ and $TiO_2$ layers. When the insulation layer 60b is a distributed Bragg reflector formed by stacking multiple layers, it is possible to efficiently suppress generation of defects such as pinholes in the insulation layer 60b, whereby the insulation layer 60b can be formed to a smaller thickness than in the related art.

As shown in FIG. 9, the current blocking layer 60a and the insulation layer 60b may be connected to each other. However, it should be understood that the present disclosure is not limited thereto.

Then, a transparent electrode layer 61 is formed on the first and second light emitting cells S1, S2. The transparent electrode layer 61 may be formed of an indium tin oxide (ITO) layer, a conductive oxide layer such as a zinc oxide layer, or a metal layer such as Ni/Au. The transparent electrode layer 61 is connected to the upper semiconductor layer 59 and is partially placed on the current blocking layer 60a. The transparent electrode layer 61 may be formed by a lift-off process, without being limited thereto. Alternatively, the transparent electrode layer 61 may be formed by a photolithography and etching process.

Figure 10:
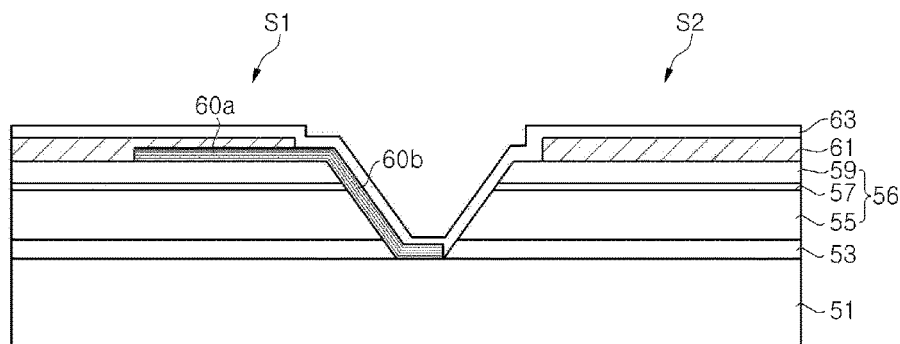

Referring to FIG. 10, an insulation protective layer 63 is formed to cover the first and second light emitting cells S1, S2. The insulation protective layer 63 covers the transparent electrode layer 61 and the insulation layer 60b. In addition, the insulation protective layer 63 may cover an overall area of the first and second light emitting cells S1, S2. The insulation protective layer 63 may be formed of an insulation material layer, such as a silicon oxide or silicon nitride layer, by chemical vapor deposition.

Figure 11:
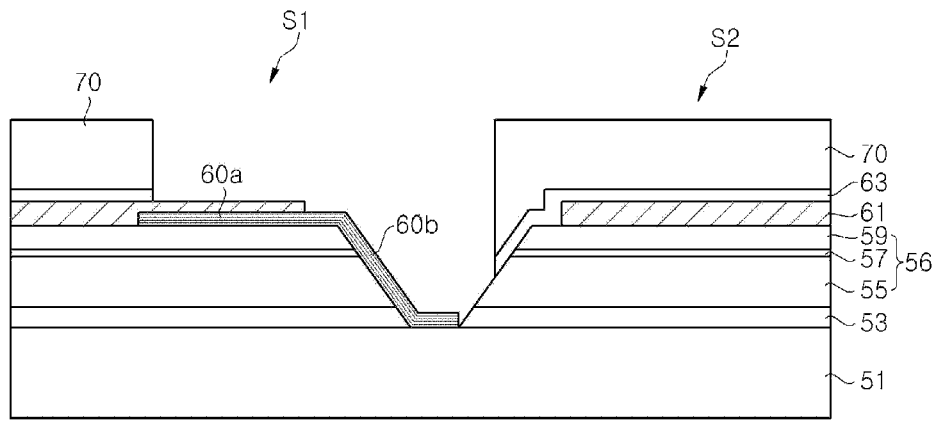

Referring to FIG. 11, a mask pattern 70 having an opening is formed on the insulation protective layer 63. The opening of the mask pattern 70 corresponds to a region for an interconnection line. Then, some region of the insulation protective layer 63 is removed by etching through the mask pattern 70. As a result, an opening is formed on the insulation protective layer 63 to expose some of the transparent electrode layer 61 and the insulation layer 60b while exposing the slanted side surface of the lower semiconductor layer 55 of the second light emitting cell S2.

Figure 12:
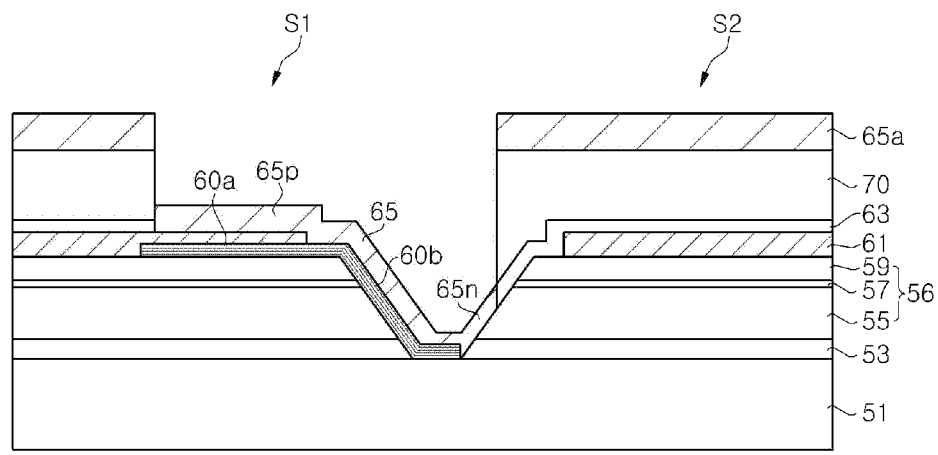

Referring to FIG. 12, with the mask pattern 70 remaining on the insulation protective layer 63, a conductive material is deposited to form the interconnection line 65 within the opening of the mask pattern 70. Here, some of the conductive material 65a may be deposited on the mask pattern 70. The conductive material may be deposited by plating, e-beam evaporation, sputtering, and the like.

Referring to FIG. 11, the mask pattern 70, together with some of the conductive material 65a, is removed from the mask pattern 70. As a result, the interconnection line 65 electrically connecting the first and second light emitting cells S1, S2 to each other is completed.

Here, a first connection section 65p of the interconnection line 65 is connected to the transparent electrode layer 61 of the first light emitting cell S1, and a second connection section 65n thereof is connected to the slanted side surface of the lower semiconductor layer 55 of the second light emitting cell S2. The first connection section 65p of the interconnection line 65 may be connected to the transparent electrode layer 60a within an upper region of the current blocking layer 60a. The interconnection line 65 is separated from the side surface of the first light emitting cell S1 by the insulation layer 60b.

In this embodiment, the current blocking layer 60a and the insulation layer 60b are formed by the same process. As a result, the insulation protective layer 63 and the interconnection line 65 may be formed using the same mask pattern 70, whereby the MJT LED chip can be manufactured by the same number of exposure processes while adding the current blocking layer 60a.

Figure 14:
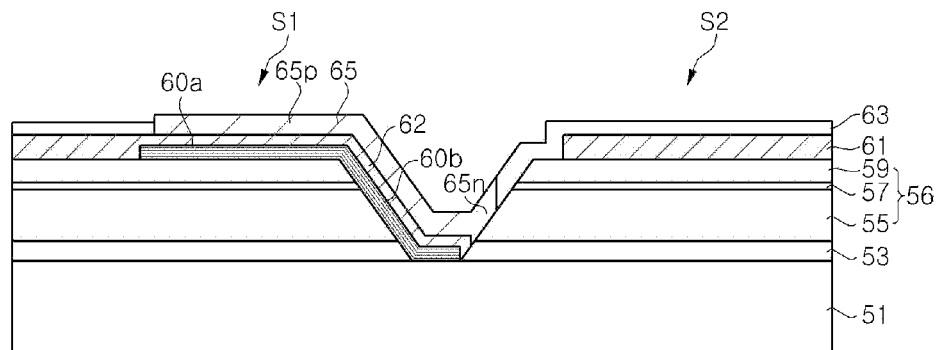
FIG. 14 is a schematic sectional view of an MJT LED chip according to another exemplary embodiment of the present disclosure.

FIG. 14 is a schematic sectional view of an MJT LED chip according to another exemplary embodiment of the present disclosure.

Referring to FIG. 14, the MJT LED chip according to this embodiment is generally similar to the MJT LED chip described with reference to FIGS. 5 and 6, and further includes a transparent conductive layer 62.

The growth substrate 51, the light emitting cells S1, S2, the buffer layer 53, the transparent electrode layer 61, the current blocking layer 60a, the insulation layer 60b, the insulation protective layer 63 and the interconnection line 65 are similar to those of the light emitting diode described with reference to FIGS. 5 and 6, and thus detailed descriptions thereof will be omitted.

The transparent conductive layer 62 is placed between the insulation layer 60b and the interconnection line 65. The transparent conductive layer 62 has a narrower width than the insulation layer 60b, thereby preventing a short circuit of the upper semiconductor layer 59 and the lower semiconductor layer 55 due to the transparent conductive layer 62.

On the other hand, the transparent conductive layer 62 is connected to a first transparent electrode layer 61, and may electrically connect the first transparent electrode layer 61 to the second light emitting cell S2. For example, the transparent conductive layer 62 may be connected at one end thereof to the lower semiconductor layer 55 of the second light emitting cell. In addition, when two or more light emitting cells are connected thereto, a second transparent conductive layer 62 may extend from a second transparent electrode layer 61 on the second light emitting cell S2.

In this embodiment, since the transparent conductive layer 62 is placed between the interconnection line 65 and the insulation layer 60b, current can flow through the transparent conductive layer 62 even in the case where the interconnection line 65 is disconnected, thereby improving electric stability of the MJT LED chip.

FIG. 15 to FIG. 18 are schematic sectional views illustrating a method of fabricating an MJT LED chip according to another exemplary embodiment of the present disclosure.

Figure 15:
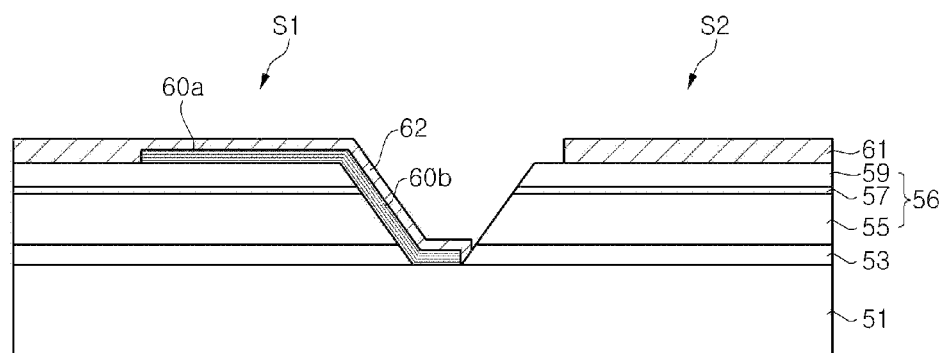
FIG. 15 to FIG. 18 are schematic sectional views illustrating a method of fabricating an MJT LED chip according to another exemplary embodiment of the present disclosure.

Referring to FIG. 15, first, as described with reference to FIGS. 7 and 8, a semiconductor stack structure 56 is formed on a growth substrate 51, and a plurality of light emitting cells S1, S2 separated from each other is formed by a photolithography and etching process. Then, as described with reference to FIG. 9, a current blocking layer 60a covering a region on the first light emitting cell S1 and an insulation layer 60b partially covering a side surface of the first light emitting cell S1 are formed.

As described with reference to FIG. 9, each of the current blocking layer 60a and the insulation layer 60b may include a distributed Bragg reflector formed by alternately stacking layers having different indices of refraction, for example, $SiO_2$ and $TiO_2$ layers. When the insulation layer 60b include the distributed Bragg reflector formed by stacking multiple layers, it is possible to efficiently suppress generation of defects such as pinholes in the insulation layer 60b, whereby the insulation layer 60b can be formed to a smaller thickness than in the related art.

Then, a transparent electrode layer 61 is formed on the first and second light emitting cells S1, S2. As described with reference to FIG. 9, the transparent electrode layer 61 may be formed of an indium tin oxide (ITO) layer, a conductive oxide layer such as a zinc oxide layer, or a metal layer such as Ni/Au. The transparent electrode layer 61 is connected to the upper semiconductor layer 59 and is partially placed on the current blocking layer 60a. The transparent electrode layer 61 may be formed by a lift-off process, without being limited thereto. Alternatively, the transparent electrode layer 61 may be formed by a photolithography and etching process.

During formation of the transparent electrode layer 61, a transparent conductive layer 62 is formed. The transparent conductive layer 62 may be formed together with the transparent electrode layer 61 using the same material and the same process. The transparent conductive layer 62 is formed on the insulation layer 60b and may be connected to the transparent electrode layer 61. Further, the transparent conductive layer 62 may be electrically connected at one end thereof to the slanted side surface of the lower semiconductor layer 55 of the second light emitting cell S2.

Figure 16:
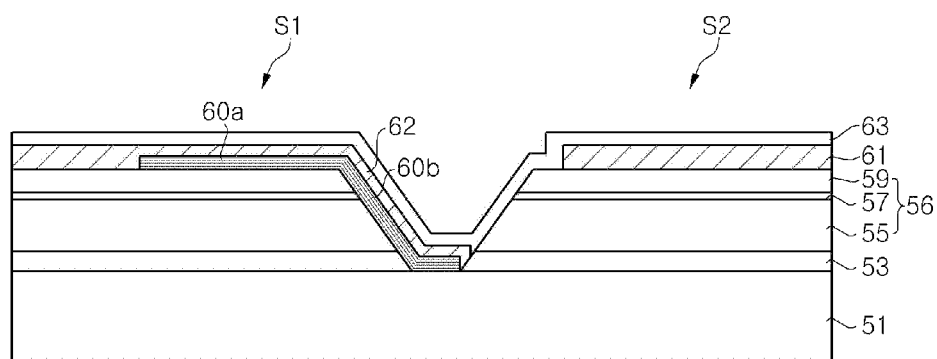

Referring to FIG. 16, an insulation protective layer 63 is formed to cover the first and second light emitting cells S1, S2. The insulation protective layer 63 covers the transparent electrode layer 61, the transparent conductive layer 62, and the insulation layer 60b. In addition, the insulation protective layer 63 may cover an overall area of the first and second light emitting cells S1, S2. The insulation protective layer 63 may be formed of an insulation material layer, such as silicon oxide or silicon nitride, by chemical vapor deposition.

Figure 17:
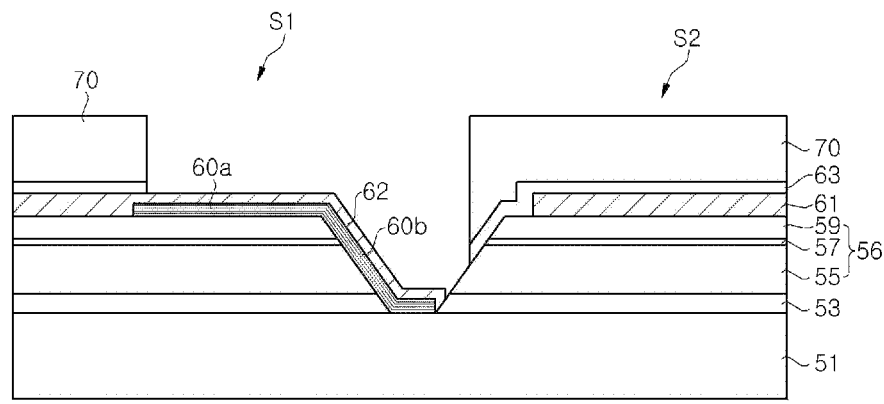

Referring to FIG. 17, as described with reference to FIG. 11, a mask pattern 70 having an opening is formed on the insulation protective layer 63. The opening of the mask pattern 70 corresponds to a region for an interconnection line. Then, a portion of the insulation protective layer 63 is removed by etching through the mask pattern 70. As a result, an opening is formed on the insulation protective layer 63 to expose some of the transparent electrode layer 61 and the transparent conductive layer 62, while exposing the slanted side surface of the lower semiconductor layer 55 of the second light emitting cell S2. Further, the insulation layer 60b is partially exposed through the opening.

Figure 18:
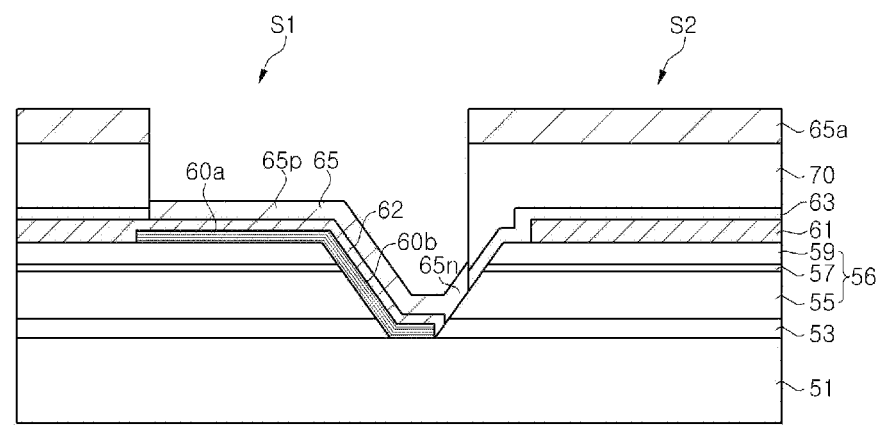

Referring to FIG. 18, as described with reference to FIG. 12, with the mask pattern 70 remaining on the insulation protective layer 63, a conductive material is deposited to form an interconnection line 65 within the opening of the mask pattern 70.

Figure 13:
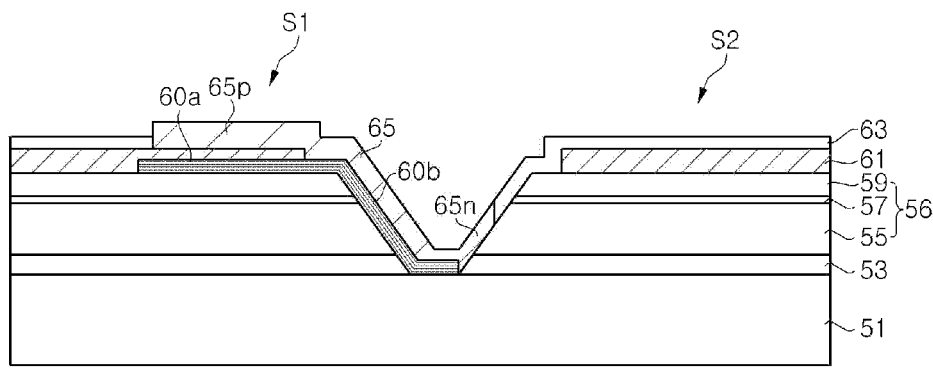

Then, referring to FIG. 13, the mask pattern 70, together with some of the conductive material 65a, is removed from the mask pattern 70. As a result, the interconnection line 65 electrically connecting the first and second light emitting cells S1, S2 to each other is completed.

In the embodiments described with reference to FIG. 7 to FIG. 13, the insulation layer 60b can be damaged during etching of the insulation protective layer 63. For example, when the insulation protective layer 63 is subjected to etching using an etchant, which contains, for example, hydrofluoric acid, the insulation layer 60b including an oxide layer can be damaged by the etchant. In this case, the insulation layer 60b can fail to insulate the interconnection line 65 from the first light emitting cell S1, thereby causing a short circuit.

However, in the present embodiment, since the transparent conductive layer 62 is placed on the insulation layer 60b, the insulation layer 60b under the transparent conductive layer 62 can be protected from etching damage. As a result, it is possible to prevent a short circuit due to the interconnection line 65.

In this embodiment, the transparent electrode layer 61 and the transparent conductive layer 62 may be formed by the same process. Accordingly, the MJT LED chip can be manufactured by the same number of exposing processes while adding the transparent conductive layer 62.

Figure 34:
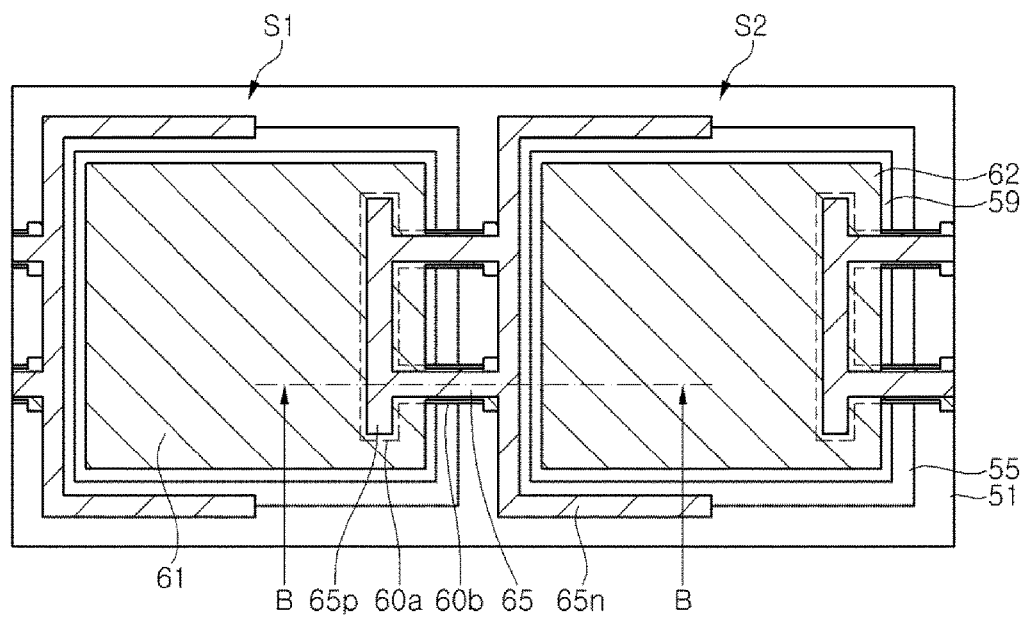
FIG. 34 is a schematic plan view of an MJT LED chip according to one exemplary embodiment of the present disclosure.
Figure 35:
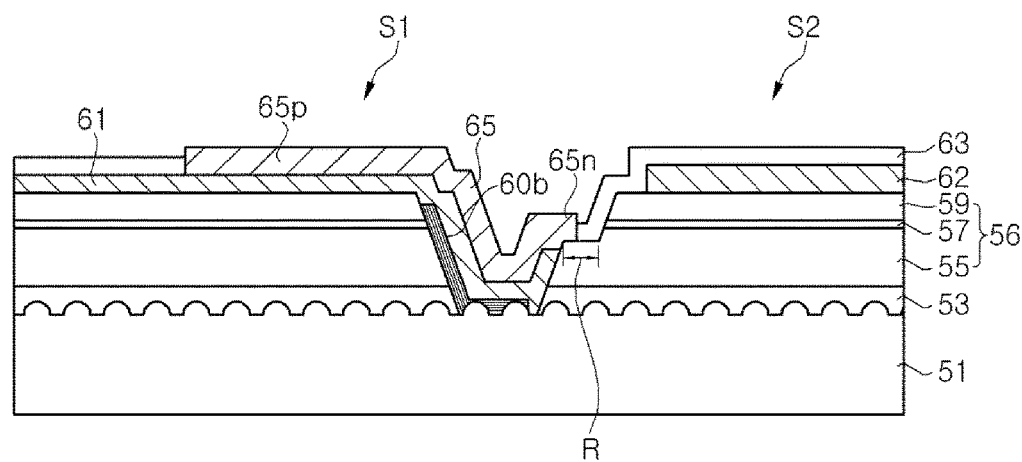
FIG. 35 is a schematic cross-sectional view of the MJT LED chip taken along section B-B of FIG. 34.

FIG. 34 is a schematic sectional view of an MJT LED chip according to another exemplary embodiment of the present disclosure, and FIG. 35 is a cross-sectional view of the MJT LED chip taken along section B-B of FIG. 34.

Referring to FIG. 34 and FIG. 35, the MJT LED chip 123 includes a growth substrate 51, light emitting cells S1, S2, transparent electrode layers 61, 62, an insulation layer 60b, an insulation protective layer 63, and an interconnection line 65. Further, the MJT LED chip 123 may include a buffer layer 53. Further, the MJT LED chip 123 may include a current blocking layer 60a.

The growth substrate 51 may be an insulation or conductive substrate, and may be, for example, a sapphire substrate, a gallium nitride substrate, a silicon carbide (SiC) substrate, or a silicon substrate. In addition, the growth substrate 51 may have a convex-concave pattern (not shown) on an upper surface thereof as in a patterned sapphire substrate. The convex-concave pattern may serve to effectively reflect light toward the growth substrate among lights emitted from the light emitting cells to improve light extraction efficiency.

A first light emitting cell S1 and a second light emitting cell S2 are disposed on a single growth substrate 51 to be spaced apart from each other. Each of the first and second light emitting cells S1, S2 has a stack structure 56, which includes a lower semiconductor layer 55, an upper semiconductor layer 59 disposed on a region of the lower semiconductor layer 55, and an active layer 57 interposed between the lower semiconductor layer 55 and the upper semiconductor layer 59. Here, the upper and lower semiconductor layers may be an n-type semiconductor layer and a p-type semiconductor layer, respectively, or vice versa.

Each of the lower semiconductor layer 55, the active layer 57 and the upper semiconductor layer 59 may be formed of a gallium nitride-based semiconductor material, that is, (Al, In, Ga)N. The compositional elements and ratio of the active layer 57 are determined depending upon desired wavelengths of light, for example, UV light or blue light, and the lower semiconductor layer 55 and the upper semiconductor layer 59 are formed of a material having a greater band gap than the active layer 57.

The lower semiconductor layer 55 and/or the upper semiconductor layer 59 may have a single layer structure, as illustrated. Alternatively, these semiconductor layers may have a multilayer structure. Further, the active layer 57 may have a single quantum-well structure or a multi-quantum well structure.

Each of the first and second light emitting cells S1, S2 may have a slanted side surface having an inclination of which may range, for example, from 15° to 80° relative to an upper surface of the growth substrate 51.

The active layer 57 and the upper semiconductor layer 59 are disposed on the lower semiconductor layer 55. At least a portion of an upper surface of the lower semiconductor layer 55 may be covered by the active layer 57, and the remaining portions thereof may not be covered by the active layer 57, but be exposed. For example, as shown in FIG. 6 and FIG. 35, the upper surface of the lower semiconductor layer 55 may include an exposed region R. The exposed region R is a region, which is not covered by the active layer 57 and the upper semiconductor layer 59, but in which a portion of the lower semiconductor layer 55, specifically, the upper surface of the lower semiconductor layer 55 is exposed. The exposed region R may be disposed to be in parallel to a side surface which is directed to an adjacent light emitting cell, among side surfaces of the lower semiconductor layer 55. However, the position of the exposed region R is not limited thereto, but may also be disposed to surround at least a portion of the active layer 57 and the upper semiconductor layer 59.

Although portions of the first light emitting cell S1 and the second light emitting cell S2 are shown in FIG. 35, the first and second light emitting cells S1, S2 may have a similar or the same structure as the first and second light emitting cells S1, S2 shown in FIG. 34. That is, the first light emitting cell S1 and the second light emitting cell S2 may have the same gallium nitride-based semiconductor stack structure, and may have slanted side surfaces of the same structure.

The buffer layer 53 may be interposed between the light emitting cells S1, S2 and the growth substrate 51. The buffer layer 53 is adopted to alleviate lattice mismatch between the growth substrate 51 and the lower semiconductor layer 55 formed thereon.

The transparent electrode layers 61, 62 are disposed on each of the light emitting cells S1, S2. More specifically, a first transparent electrode layer 61 is disposed on the first light emitting cell S1 and a second transparent electrode layer 62 is disposed on the second light emitting cell S2. The transparent electrode layers 61, 62 may be disposed on the upper surface of the upper semiconductor layer 59 to be connected to the upper semiconductor layer 59, and may have a narrower area than the upper semiconductor layer 59. That is, the transparent electrode layers 61, 62 may be recessed from an edge of the upper semiconductor layer 59. With this structure, it is possible to prevent or reduce current crowding at the edges of the transparent electrode layers 61, 62 through the side surfaces of the light emitting cells S1, S2.

A portion of the first transparent electrode layer 61 may be connected to the second light emitting cell S2. Specifically, the portion of the first transparent electrode layer 61 may be disposed on the first light emitting cell S1, between the first light emitting cell S1 and the second light emitting cell S2, and on the side surface of the lower semiconductor layer 55 of the second light emitting cell S2. Thus, also in the case in which the interconnection line 65 is short-circuited, the current may flow through the first transparent electrode layer 61, thereby improving electrical stability of the MJT LED chip. Further, the first transparent electrode layer 61 may be further extended to be disposed on the exposed region R of the upper surface of the lower semiconductor layer 55. The first transparent electrode layer 61 may be spaced apart from the active layer 57 and the upper semiconductor layer 59 of the second light emitting cell S2.

The insulation layer 60b covers a portion of the side surface of the first light emitting cell S1. As shown in FIG. 34 and FIG. 35, the insulation layer 60b may extend to a region between the first light emitting cell S1 and the second light emitting cell S2, and may cover a portion of a side surface of the lower semiconductor layer 55 of the second light emitting cell S2. The insulation layer 60b may be formed of an insulating material, and may particularly include a distributed Bragg reflector in which layers having different reflective indexes are alternately stacked. However, the insulation layer 60b is not limited thereto. When the insulation layer 60b includes a distributed Bragg reflector, which is multiple layers, it is possible to efficiently suppress generation of defects such as pinholes in the insulation layer 60b.

The interconnection line 65 electrically connects the first light emitting cell S1 to the second light emitting cell S2. The interconnection line 65 includes a first connection section 65p and a second connection section 65n. The first connection section 65p is electrically connected to the transparent electrode layer 61 on the first light emitting cell S1, and the second connection section 65n is electrically connected to the lower semiconductor layer 55 of the second light emitting cell S2. The first connection section 65p may be disposed near one edge of the first light emitting cell S1, but is not limited thereto. In other embodiments, the first connection section 65p may be disposed in the central region of the first light emitting cell S1.

The second connection section 65n may be electrically connected to the lower semiconductor layer 55 of the second light emitting cell S2. Specifically, the second connection section 65n may be electrically connected to the upper surface of the lower semiconductor layer 55 of the second light emitting cell S2 through the exposed region R. Further, the first transparent electrode layer 61 may be disposed between the second connection section 65n and the lower semiconductor layer 55 of the second light emitting cell S2. In this case, the first transparent electrode layer 61 may be disposed on a side surface of the lower semiconductor layer 55 of the second light emitting cell S2, and may also be disposed on the exposed region R of the lower semiconductor layer 55.

The second connection section 65n may contact the slanted side surface of the second light emitting cell S2, more particularly, the slanted side surface of the lower semiconductor layer 55 of the second light emitting cell S2. Further, as shown in FIG. 34, the second connection section 65n may electrically contact the slanted side surface of the lower semiconductor layer 55 while extending to both sides along the circumference of the second light emitting cell S2. The first light emitting cell S1 is connected to the second light emitting cell S2 in series by the first and second connection sections 65p, 65n of the interconnection line 65.

The interconnection line 65 may contact the transparent electrode layers 61, 62 over an overlapping region with the transparent electrode layers 61, 62. In the related art, a portion of the insulation layer is disposed between a transparent electrode layer and an interconnection line. However, according to an exemplary embodiment of the present disclosure, the interconnection line 65 may directly contact the transparent electrode layers 61, 62 without any insulation material interposed therebetween.

With respect to the width of the interconnection line 65, the width of a portion of the first transparent electrode layer 61 disposed on the side surface of the lower semiconductor layer 55 of the second light emitting cell S2 may be wider than that of a portion of the interconnection line 65 disposed on the side surface of the lower semiconductor layer 55 of the second light emitting cell S2. Thus, since a current in a region in which the side surface of the second light emitting cell S2 and the interconnection line 65 contact may be easily distributed, light emitting uniformity of the MJT LED chip may be improved.

Further, the width of a portion of the first transparent electrode layer 61 disposed between the first light emitting cell S1 and the second light emitting cell S2 may be wider than that of a portion of the interconnection line 65 disposed between the first light emitting cell S1 and the second light emitting cell S2. In general, when the insulation protective layer 63 is etched using an etchant such as hydrofluoric acid, the insulation layer 60b including an oxide layer may be damaged by the etchant. In this case, since the insulation layer 60b does not insulate the interconnection line 65 from the first light emitting cell S1, a short-circuit may occur. On the other hand, according to an exemplary embodiment of the present disclosure, since the first transparent electrode layer 61 is disposed on the insulation layer 60b, and the width of the portion of the first transparent electrode layer 61 disposed between the first light emitting cell S1 and the second light emitting cell S2 is wider than that of the portion of the interconnection line 65 disposed between the first light emitting cell S1 and the second light emitting cell S2, the insulation layer 60b disposed below a transparent conductive layer 62 may be protected from etching damage. Thus, the short-circuit problem by the interconnection line 65 is prevented.

In FIG. 34, the first connection section 65p and the second connection section 65n of the interconnection line 65 are connected to each other through two paths. However, it should be understood that the first and second connection sections may be connected to each other via a single path or more than two paths.

When the insulation layer 60b has reflective characteristics like the distributed Bragg reflector, the insulation layer 60b may be disposed substantially in the same region as the region for the interconnection line 65 within a region having an area of two times or less the area of the interconnection line 65. The insulation layer 60b blocks light emitted from the active layer 57 from being absorbed into the interconnection line 65. However, when occupying an excessively large area, the insulation layer 60b can block emission of light to the outside. Thus, there is a need for restriction of the area thereof.

The insulation protective layer 63 may be disposed outside the region of the interconnection line 65. The insulation protective layer 63 covers the first and second light emitting cells S1, S2 outside the region of the interconnection line 65. The insulation protective layer 63 may be formed of silicon oxide ($SiO_2$) or silicon nitride. The insulation protective layer 63 has an opening through which the transparent electrode layer 61 on the first light emitting cell S1 and the lower semiconductor layer of the second light emitting cell S2 are exposed, and the interconnection line 65 may be disposed within the opening.

A side surface of the insulation protective layer 63 and a side surface of the interconnection line 65 may face each other, and may also contact each other. One side surface of the insulation protective layer 63 may be disposed on the exposed region R and may contact the side surface of the interconnection line 65. Unlike this, the side surface of the insulation protective layer 63 and the side surface of the interconnection line 65 may be spaced apart from each other while facing each other.

According to the present embodiment, since the second connection section 65n electrically contacts the upper surface of the lower semiconductor layer 55, that is, a surface which is not slanted, the second connection section 65n disposed on the upper surface of the lower semiconductor layer 55 may have a uniform thickness, Thus, reliability of the interconnection line may be improved. In addition, since the insulation protective layer 63 contacts the interconnection line 65 on the upper surface of the lower semiconductor layer 55 which is not slanted with the side surface of the lower semiconductor layer of the second light emitting cell S2, an area of an interface between the insulation protective layer 63 and the interconnection line 65 may be substantially constant. Thus, an error rate of the MJT LED may be reduced.

In addition, the current blocking layer 60a and the insulation layer 60b may be formed of the same material and have the same structure, and thus may be formed at the same time by the same process. Further, since the interconnection line 65 is disposed within the opening of the insulation protective layer 63, the insulation protective layer 63 and the interconnection line 65 may be formed using the same mask pattern.

Although two light emitting cells including the first light emitting cell S1 and the second light emitting cell S2 are illustrated in this exemplary embodiment, it should be understood that the present disclosure is not limited thereto. Specifically, a greater number of light emitting cells may be electrically connected to each other via the interconnection lines 65. For example, the interconnection lines 65 may electrically connect the lower semiconductor layers 55 and the transparent electrode layers 61 of adjacent light emitting cells to each other to form a series array of light emitting cells. A plurality of such arrays may be formed and connected inversely parallel to each other to be operated by an AC power source connected thereto. In addition, a bridge rectifier (not shown) may be connected to the series array of light emitting cells to allow the light emitting cells to be operated by the AC power source. The bridge rectifier may be formed by bridging the light emitting cells having the same structure as that of the light emitting cells S1, S2 using the interconnection lines 65.

As the number of light emitting cells within each of the MJT LEDs is increased, an area of each of blocks of the printed circuit board may be decreased. Thus, the backlight unit capable of implementing various light emitting arrangements by the plurality of MJT LEDs while reducing a droop phenomenon by more light emitting cells may be provided.

FIG. 36 through FIG. 42 are cross-sectional views illustrating a method of fabricating an MJT LED chip 123 according to one exemplary embodiment of the present disclosure.

Figure 36:
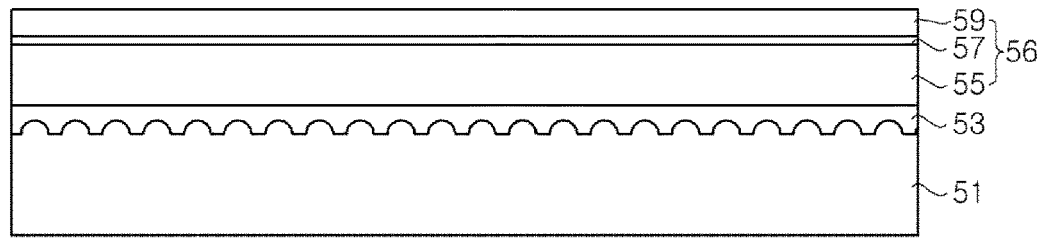
FIG. 36 through FIG. 41 are schematic cross-sectional views illustrating a method of fabricating an MJT LED chip according to one exemplary embodiment of the present disclosure.

Referring to FIG. 36, a semiconductor stack structure 56 including a lower semiconductor layer 55, an active layer 57 and an upper semiconductor layer 59 is formed on a growth substrate 51. In addition, a buffer layer 53 may be formed on the growth substrate 51 before the formation of the lower semiconductor layer 55.

The growth substrate 51 may be sapphire ($Al_2O_3$), silicon carbide (SiC), zinc oxide (ZnO), silicon (Si), gallium arsenic (GaAs), gallium phosphide (GaP), lithium alumina ($LiAl_2O_3$), boron nitride (BN), aluminum nitride (AlN), and gallium nitride (GaN) substrate, without being limited thereto. The growth substrate 51 may be selected in various ways depending upon materials of semiconductor layers to be formed on the growth substrate 51. In addition, as shown in FIG. 36, the growth substrate 51 may have a convex-concave pattern on an upper surface thereof as in a patterned sapphire substrate.

The buffer layer 53 is formed to alleviate lattice mismatch between the growth substrate 51 and the semiconductor layer 55 formed thereon, and may be formed of, for example, gallium nitride (GaN) or aluminum nitride (AlN). When the growth substrate 51 is a conductive substrate, the buffer layer 53 may be formed of an insulation layer or a semi-insulating layer. For example, the buffer layer 53 may be formed of AlN or semi-insulating GaN.

Each of the lower semiconductor layer 55, the active layer 57 and the upper semiconductor layer 59 may be formed of a gallium nitride-based semiconductor material, that is, (Al, In, Ga)N. The lower and upper semiconductor layers 55, 59 and the active layer 57 may be intermittently or continuously formed by metal organic chemical vapor deposition (MOCVD), molecular beam epitaxy, hydride vapor phase epitaxy (HVPE), and the like.

Here, the upper and lower semiconductor layers may be an n-type semiconductor layer and a p-type semiconductor layer, respectively, or vice versa. Among the gallium nitride-based compound semiconductor layers, an n-type semiconductor layer may be formed by doping an n-type impurity, for example, silicon (Si), and a p-type semiconductor layer may be formed by doping a p-type impurity, for example, magnesium (Mg).

Figure 37:
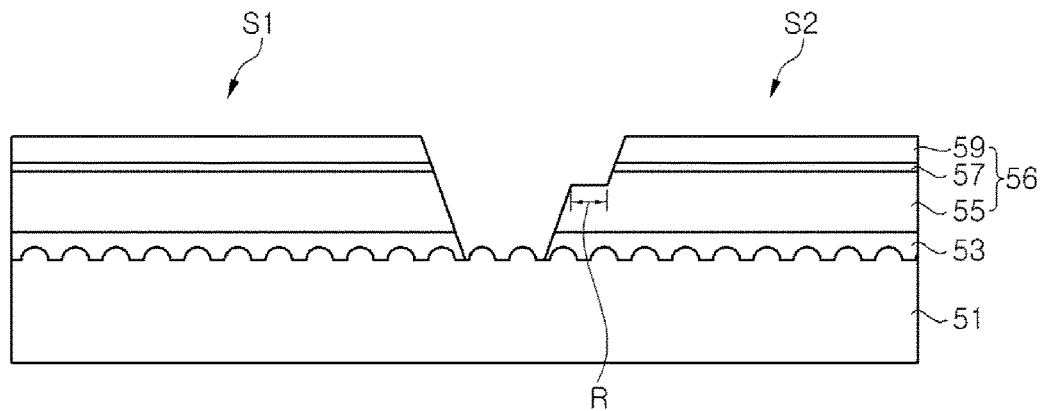

Referring to FIG. 37, a plurality of light emitting cells S1, S2 spaced apart from each other is formed by a photolithography and etching process. Each of the light emitting cells S1, S2 is formed to have a slanted side surface. Further, in order to partially expose an upper surface of the lower semiconductor layer 55 of each of the light emitting cells S1, S2, a photolithography and etching process of partially removing the active layer 57 and the upper semiconductor layer 59 is added.

Figure 38:
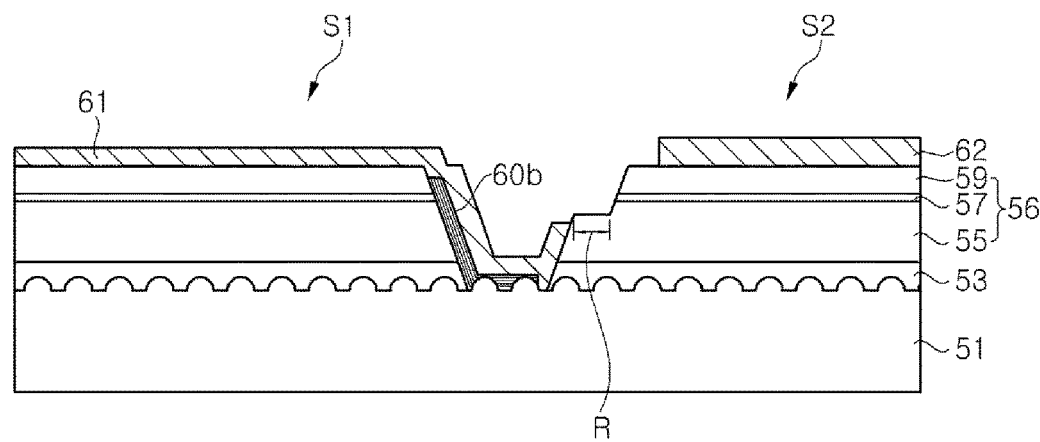
Figure 39:
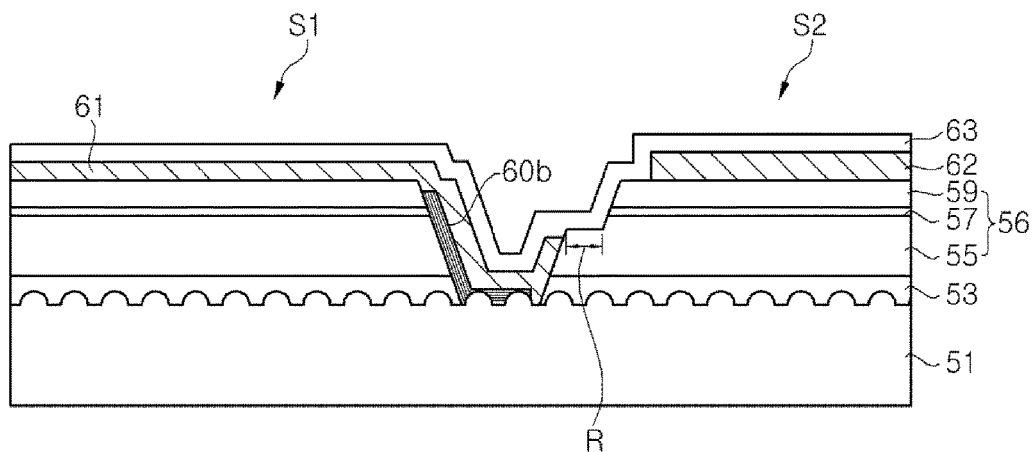

Referring to FIG. 38, an insulation layer 60b partially covering the side surface of the first light emitting cell S1 is formed. The insulation layer 60b may also extend to cover a region between the first light emitting cell S1 and the second light emitting cell S2 while partially covering a side surface of the lower semiconductor layer 55 of the second light emitting cell S2.

The insulation layer 60b may be formed by depositing an insulation material layer, followed by patterning through the photolithography and etching process. Alternatively, the insulation layer 60b may be formed of an insulation material layer by a lift-off technique. Particularly, the insulation layer 60b may be formed of a distributed Bragg reflector in which layers having different reflective indexes, for example, $SiO_2$ and $TiO_2$ are alternately stacked. When the insulation layer 60b is formed of a distributed Bragg reflector, which is multiple layers, it is possible to suppress generation of defects such as pinholes in the insulation layer 60b, whereby the insulation layer 60b can be formed to have a smaller thickness than that of an insulation layer in the related art.

Then, the transparent electrode layers 61, 62 are formed on the first and second light emitting cells S1, S2. The transparent electrode layers 61, 62 may be formed of an indium tin oxide (no) layer, a conductive oxide layer such as a zinc oxide layer, or a metal layer such as Ni/Au. The transparent electrode layers 61, 62 are connected to the upper semiconductor layer 59 and are partially disposed on the insulation layer 60b. Further, a portion of the transparent electrode layers 61, 62, for example, the first transparent electrode layer 61 may be disposed between the first light emitting cell S1 and the second light emitting cell S2, and on the side surface of the lower semiconductor layer 55 of the second light emitting cell S2. The transparent electrode layers 61, 62 may be formed by a lift-off process, without being limited thereto. Alternatively, the transparent electrode layers 61, 62 may be formed by a photolithography and etching process.

Referring to FIG. 10, an insulation protective layer 63 is formed to cover the first and second light emitting cells S1, S2. The insulation protective layer 63 covers the transparent electrode layers 61, 62 and the insulation layer 60b. In addition, the insulation protective layer 63 may cover an overall area of the first and second light emitting cells S1, S2. The insulation protective layer 63 may be formed of an insulation material layer, such as a silicon oxide or silicon nitride layer, by chemical vapor deposition.

Referring to FIG. 11, a mask pattern 70 having an opening is formed on the insulation protective layer 63. The opening of the mask pattern 70 corresponds to a region for an interconnection line. Then, some region of the insulation protective layer 63 is removed by etching through the mask pattern 70. As a result, an opening is formed on the insulation protective layer 63 to expose some of the transparent electrode layers 61, 62 and the insulation layer 60b while exposing the exposed region R of the lower semiconductor layer 55 of the second light emitting cell S2.

Figure 41:
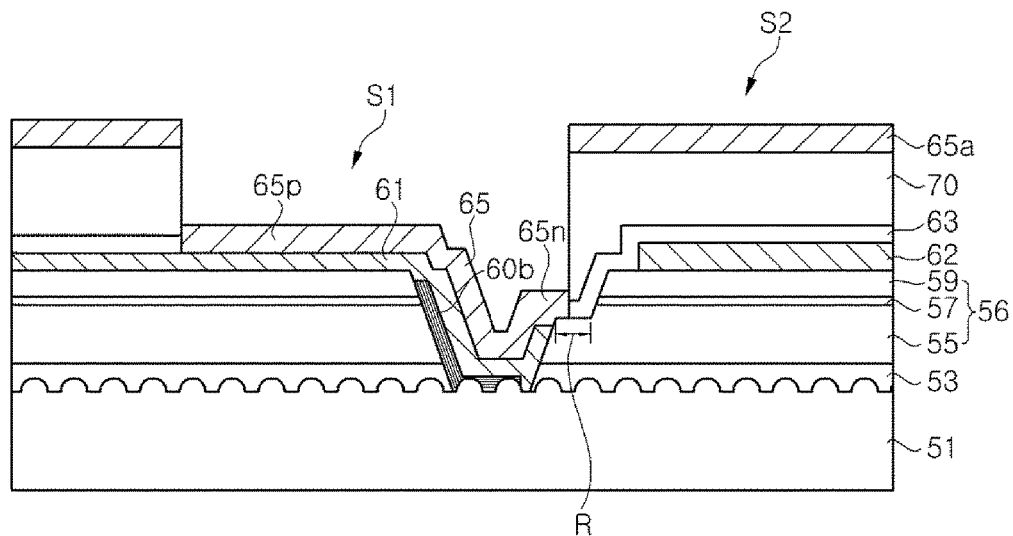

Referring to FIG. 41, with the mask pattern 70 remaining on the insulation protective layer 63, a conductive material is deposited to form the interconnection line 65 within the opening of the mask pattern 70. Here, some of the conductive material 65a may be deposited on the mask pattern 70. The conductive material may be deposited by plating, e-beam evaporation, sputtering, or the like.

Figure 40:
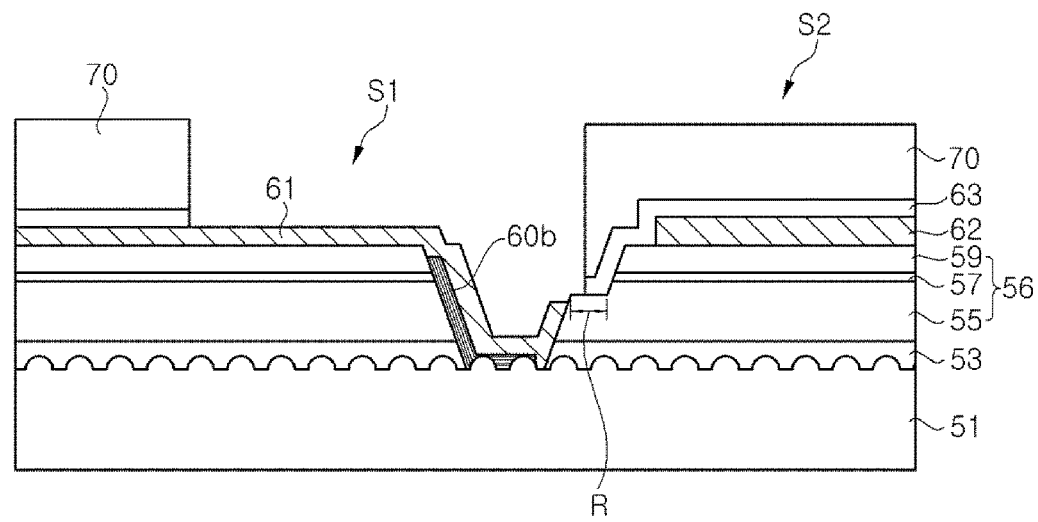

Referring to FIG. 40, the mask pattern 70, together with some of the conductive material 65a, is removed from the mask pattern 70. As a result, the interconnection line 65 electrically connecting the first and second light emitting cells S1, S2 to each other is completed.

Here, a first connection section 65p of the interconnection line 65 is connected to the transparent electrode layer 61 of the first light emitting cell S1, and a second connection section 65n thereof is connected to the upper surface of the lower semiconductor layer 55 of the second light emitting cell S2, specifically, the exposed region R. The interconnection line 65 is spaced apart from the side surface of the first light emitting cell S1 by the insulation layer 60b.

In this exemplary embodiment, the current blocking layer 60a and the insulation layer 60b are formed by the same process. As a result, the insulation protective layer 63 and the interconnection line 65 may be formed using the same mask pattern 70, whereby the MJT LED chip can be manufactured by the same number of exposure processes while adding the current blocking layer 60a.

Figure 42:
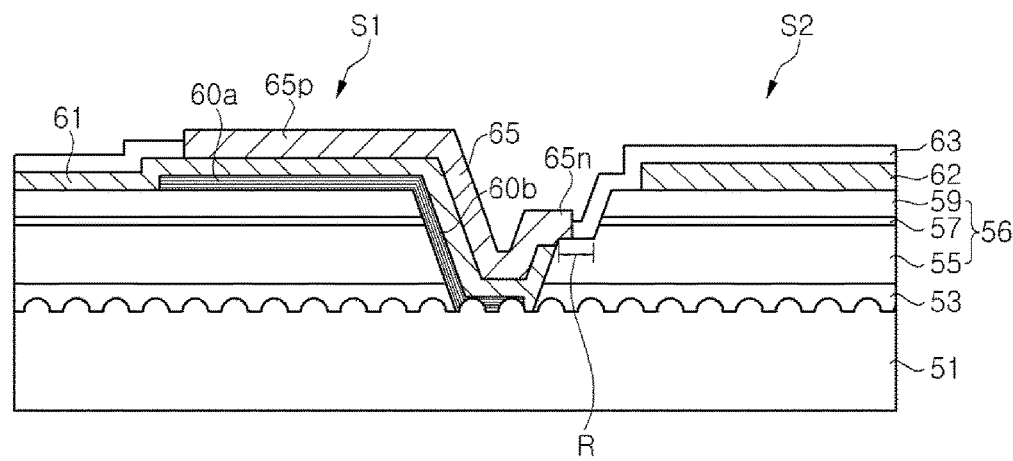
FIG. 42 is a schematic cross-sectional view of an MJT LED chip according to another exemplary embodiment of the present disclosure.

FIG. 42 is a cross-sectional view illustrating an MJT LED chip according to another exemplary embodiment of the present disclosure. The MJT LED chip of FIG. 42 is similar to the MJT LED chip described with reference to FIG. 35, but has a difference in that it further includes a current blocking layer 60a.

The current blocking layer 60a may be disposed on each of the light emitting cells S1, S2, and may be disposed between the transparent electrode layers 61, 62 and the light emitting cells S1, S2. Specifically, the current blocking layer 60a may be disposed between the first light emitting cell S1 and the first transparent electrode layer 61, thereby spacing a portion of the first transparent electrode layer 61 from the first light emitting cell S1. Thus, the transparent electrode layers 61, 62 are partially disposed on the current blocking layer 60a. The current blocking layer 60a may be disposed near an edge of each of the light emitting cells S1, S2, but is not limited thereto. The current blocking layer 60a may also be disposed in the center region of each of the light emitting cells S1, S2.

Since a phenomenon in which the current is concentrated around the interconnection line 65 may be alleviated by the current blocking layer 60a, current distribution efficiency of the MJT LED chip may be improved.

The current blocking layer 60a may be formed of an insulating material, and may particularly include a distributed Bragg reflector in which layers having different reflective indexes are alternately stacked. The insulation layer 60b may have the same structure as the current blocking layer 60a and may be formed of the same material as the current blocking layer 60a, but is not limited thereto. The insulation layer 60b may also be formed of a material different from that of the current blocking layer 60a by different processes.

The insulation layer 60b may be connected to the current blocking layer 60a to be continuously disposed, but the present disclosure is not necessarily limited thereto. The insulation layer 60b and the current blocking layer 60a may be disposed to be spaced apart from each other.

The current blocking layer 60a may be formed by depositing an insulation material layer, followed by patterning through the photolithography and etching process. Alternatively, the current blocking layer 60a may be formed of an insulation material layer by a lift-off technique. Particularly, the current blocking layer 60a may be formed of a distributed Bragg reflector in which layers having different reflective indexes, for example, $SiO_2$ and $TiO_2$ are alternately stacked. The current blocking layer 60a and the insulation layer 60b may be connected to each other as shown in FIG. 42, but the present disclosure is not necessarily limited thereto.

The current blocking layer 60a may be disposed across the entire area in which the interconnection line 65 and the transparent electrode layers 61, 62 are overlapped with each other. Further, the current blocking layer 60a and the insulation layer 60b may be disposed across the entire area in which the interconnection line 65 and the first light emitting cell S1 are overlapped with each other.

When the current blocking layer 60a has reflective characteristics like the distributed Bragg reflector, the current blocking layer 60a may be disposed substantially in the same region as the region for the interconnection line 65 within a region having an area of two times or less the area of the interconnection line 65. The current blocking layer 60a blocks light emitted from the active layer 57 from being absorbed into the interconnection line 65. However, when occupying an excessively large area, the current blocking layer 60a can block emission of light to the outside. Thus, there is a need for restriction of the area thereof.

Referring to FIG. 42, the transparent electrode layers 61, 62 are connected to the upper semiconductor layer 59 and are partially disposed on the current blocking layer 60a and the insulation layer 60b. In addition, the first connection section 65p of the interconnection line 65 may be connected to the first transparent electrode layer 61 within an upper region of the current blocking layer 60a.

Structure of optical member according to first embodiment and MJT LED module including the same Next, referring to FIG. 3, FIG. 4, and FIG. 19 to FIG. 25, detailed structures and functions of an optical member according to a first embodiment and an MJT LED module including the same will be described.

Referring to FIG. 3 again, the optical member 130 according to the first embodiment may include a lower surface 131 and an upper surface 135, and may further include a flange 137 and legs 139. The lower surface 131 includes a concave section 131a, and the upper surface 135 includes a concave surface 135a and a convex surface 135b.

The lower surface 131 is composed of a substantially circular disc-shaped plane, and has the concave section 131a placed at a central portion thereof. The lower surface 131 is not required to be a flat surface, and may have various convex-concave patterns.

Further, an inner surface of the concave section 131a has a surface 133 including side surface 133a and an upper end surface 133b. Here, the upper end surface 133b is perpendicular to a central axis C and the side surface 133a extends from the upper end surface 133b to an entrance of the concave section 131a. Herein, when aligned to coincide with the optical axis L of the MJT LED 100, the central axis C is defined as a central axis of the optical member 130, which becomes a center of a beam distribution of light exiting the optical member 130.

The concave section 131a may have a shape, a width of which gradually decreases from the entrance thereof to an upper side thereof. Specifically, the side surface 133a gradually approaches the central axis C from the entrance of the concave section 131a to the upper end surface 133b thereof. With this structure, a region for the upper end surface 133b may be formed narrower than the entrance of the concave section 131a. The side surface 133a may have a relatively gentle slope near the upper end surface 133b.

The region for the upper end surface 133b is defined within a narrower region than a region for the entrance of the concave section 131a. In addition, the region for the upper end surface 133b may be defined within a narrower region than a region surrounded by an inflection curve at which the concave surface 135a of the upper surface 135 meets the convex surface 135b thereof. Further, the region for the upper end surface 133b may be placed within a narrower region than a region for the cavity 121a (FIG. 4) of the MJT LED, that is, a light exit region.

The region for the upper end surface 133b reduces variation of the beam distribution of light exiting the optical member 130 through the upper surface 135 thereof even in the case of misalignment between the optical axis L of the MJT LED and the central axis C of the optical member 130. Thus, the region for the upper end surface 133b may be minimized in consideration of misalignment between the MJT LED 100 and the optical member 130.

Further, the upper surface 135 of the optical member 130 includes the concave surface 135a and the convex surface 135b continuously extending from the concave surface 135a with reference to the central axis C. A line at which the concave surface 135a meets the convex surface 135b becomes the inflection curve. The concave surface 135a disperses light exiting near the central axis C of the optical member 130 through refraction of the light at a relatively large angle. Further, the convex surface 135b increases the quantity of light exiting towards an outer direction of the central axis C.

The upper surface 135 and the concave section 131a have a symmetrical structure relative to the central axis C. For example, the upper surface 135 and the concave section 131a have a mirror symmetry structure relative to a plane passing through the central axis C and may have a rotational body shape relative to the central axis C. In addition, the concave section 131a and the upper surface 135 may have various shapes according to a desired light beam distribution.

In another aspect, the flange 137 connects the upper surface 135 to the lower surface 131 and defines an outer size of the optical member. A side surface of the flange 137 and the lower surface 131 may be formed with convex-concave patterns. The legs 139 of the optical member 130 are coupled to the printed circuit board 110 to support the lower surface 131 while separating the lower surface 131 from the printed circuit board 110. Coupling of the legs 139 to the printed circuit board 110 may be performed by bonding a distal end of each of the legs 139 to the printed circuit board 110 using an adhesive or by fitting each of the legs 139 into a corresponding hole formed in the printed circuit board 110.

The optical member 130 is separated from the MJT LED 100, so that an air gap is formed in the concave section 131a. The housing 121 of the MJT LED 100 is placed below the lower surface 131, and the wavelength conversion layer 125 of the MJT LED 100 is separated from the concave section 131a to be placed under the lower surface 131. With this structure, light traveling in the concave section 131a is prevented from being lost due to absorption by the housing 121 or the wavelength conversion layer 125.

According to this embodiment, when a perpendicular plane relative to the central axis C is formed within the concave section 131a, it is possible to reduce variation of the beam distribution of light exiting the optical member 130 even upon misalignment between the MJT LED 100 and the optical member 130. Furthermore, since the concave section 131a does not have a relatively sharp apex, the optical member can be easily manufactured.

FIG. 19 shows sectional views of various modifications of the optical member. Herein, various modifications of the concave section 131a shown in FIG. 3 will be described.

Figure 19A:
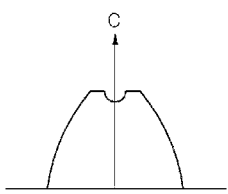
FIG. 19A, FIG. 19B, FIG. 19C and FIG. 19D show sectional views of various modifications of an optical member according to the present disclosure.

In FIG. 19A, the upper end surface 133b perpendicular to the central axis C described in FIG. 3 has a downwardly protruding surface formed at a portion thereof near the central axis C. With this downwardly protruding surface, the optical member can achieve primary control of light entering the portion of the optical member near the central axis C thereof.

Figure 19B:
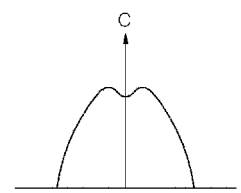

The upper end surface of FIG. 19B is similar to that of FIG. 19A except that the upper end surface of FIG. 19B has upwardly protruding surfaces formed at portions thereof perpendicular to the central axis C of the optical member. Since the upper end surface is combined with the upwardly protruding surfaces and the downwardly protruding surface, the optical member can reduce variation in light beam distribution due to misalignment between the MJT LED and the optical member.

Figure 19C:
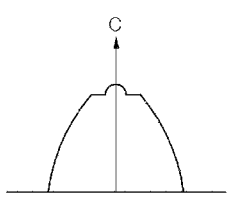

The upper end surface of FIG. 19C is different from that of FIG. 3 in that the upper end surface 133b is formed with an upwardly protruding surface at a portion thereof near the central axis C of the optical member. With this upwardly protruding surface, the optical member can achieve further dispersion of light entering the portion of the optical member near the central axis C thereof.

Figure 19D:
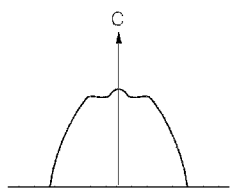

The upper end surface of FIG. 19D is similar to that of FIG. 19C except that the upper end surface has downwardly protruding surfaces at portions thereof perpendicular to the central axis C of the optical member. Since the upper end surface is combined with the upwardly protruding surfaces and the downwardly protruding surface, the optical member can reduce variation in light beam distribution due to misalignment between the MJT LED and the optical member.

FIG. 20 shows sectional views of an optical member, illustrating an MJT LED module according to a further exemplary embodiment of the present disclosure.

Figure 20A:
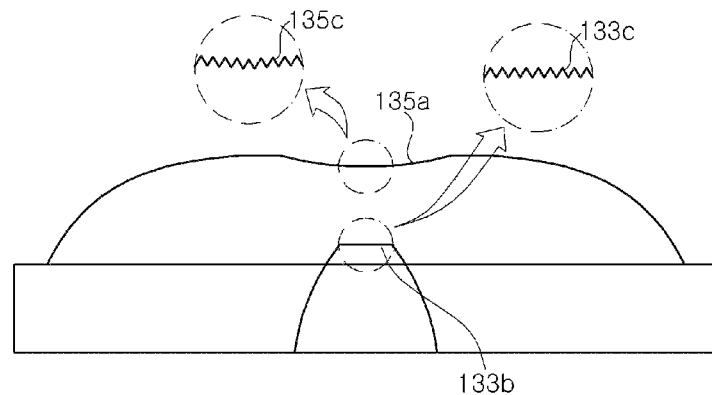
FIG. 20A and FIG. 20B show sectional views of an optical member, illustrating an MJT LED module according to a further exemplary embodiment of the present disclosure.

Referring to FIG. 20A, the upper end surface 133b may be formed with a light scattering pattern 133c. The light scattering pattern 133c may be a convex-concave pattern. In addition, the concave surface 135a may also be formed with a light scattering pattern 135c. The light scattering pattern 135c may also be a convex-concave pattern.

Generally, a relatively large luminous flux is concentrated near the central axis C of the optical member. Furthermore, according to embodiments of the present disclosure, since the upper end surface 133b is perpendicular to the central axis C, more luminous flux can be concentrated near the central axis C. Accordingly, with the structure of the upper end surface 133b and/or the concave surface 135a having the light scattering patterns 133c, 135c, it is possible to disperse luminous flux near the central axis C of the optical member.

Figure 20B:
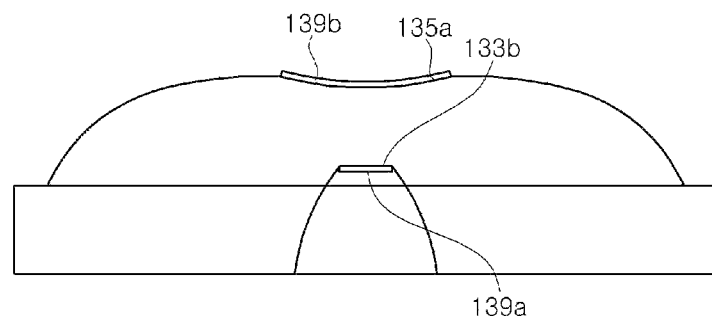

Referring to FIG. 20B, a material layer 139a having a different index of refraction than that of the optical member 130 may be placed on the upper end surface 133b. The index of refraction of the material layer 139a may be higher than that of the optical member, thereby allowing change of an optical path of light incident on the upper end surface 133b.

Further, a material layer 139b having a different index of refraction than that of the optical member 130 may also be placed on the concave surface 135a. The index of refraction of the material layer 139b may be higher than that of the optical member, thereby allowing change of an optical path of light exiting through the concave surface 135a.

The light scattering patterns 133c, 135c of FIG. 20A and the material layers 139a, 139b of FIG. 20B may also be applied to the various optical members of FIG. 19.

Figure 21:
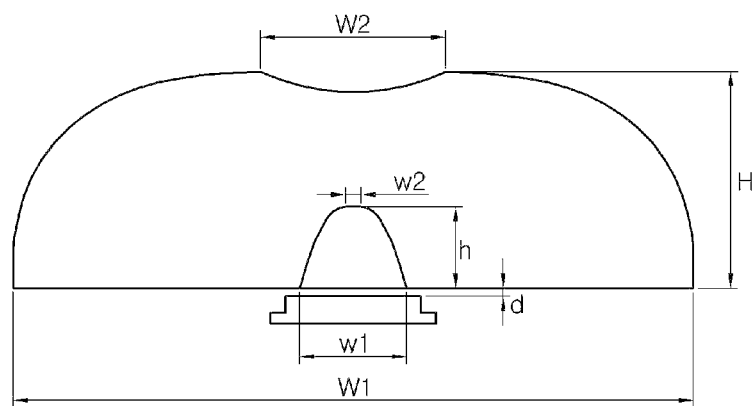
FIG. 21 is a sectional view illustrating dimensions of an MJT LED module used for simulation.

FIG. 21 is a sectional view illustrating dimensions of an MJT LED module used for simulation. Here, the same reference numerals as those of FIGS. 3 and 4 are used (please also refer to FIGS. 3 and 4 for a depiction of some elements).

In the MJT LED 100, the cavity 121a has a diameter of 2.1 mm and a height of 0.6 mm. The wavelength conversion layer 125 fills the cavity 121a and has a flat surface. A distance (d) between the MJT LED 100 and the lower surface 131 of the optical member 130 is 0.18 mm and the MJT LED 100 and the optical member 130 are arranged such that the optical axis L of the MJT LED 100 is aligned with the central axis C of the optical member.

The optical member 130 has a height (H) of 4.7 mm and an upper surface of the optical member has a width (W1) of 15 mm. The concave surface 135a has a width (W2) of 4.3 mm. Further, the entrance of the concave section 131a placed on the lower surface 131 has a width (w1) of 2.3 mm, and the upper end surface 133b has a width (w2) of 0.5 mm. The concave section 131a has a height (h) of 1.8 mm.

Figure 22A:
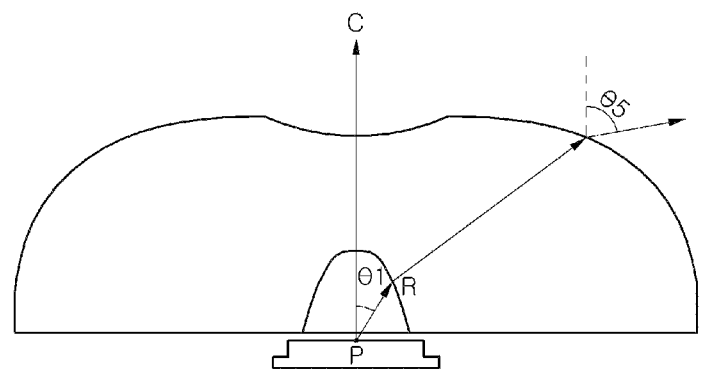
FIG. 22A, FIG. 22B and FIG. 22C show graphs depicting a shape of an optical member of FIG. 21.
Figure 22B:
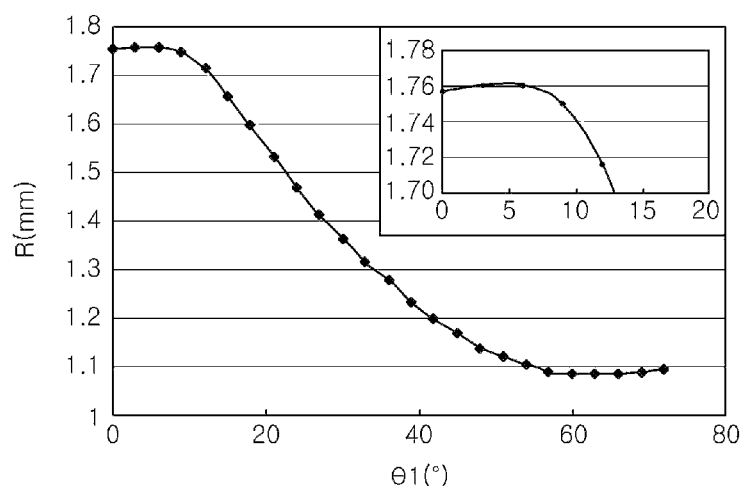
Figure 22C:
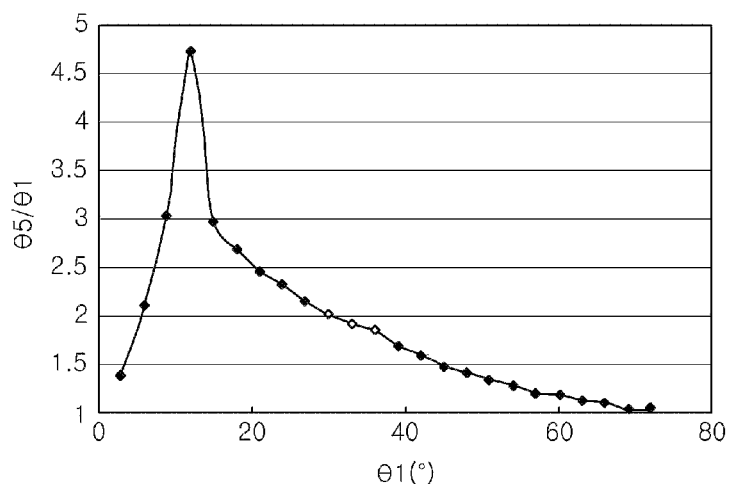
Figure 23:
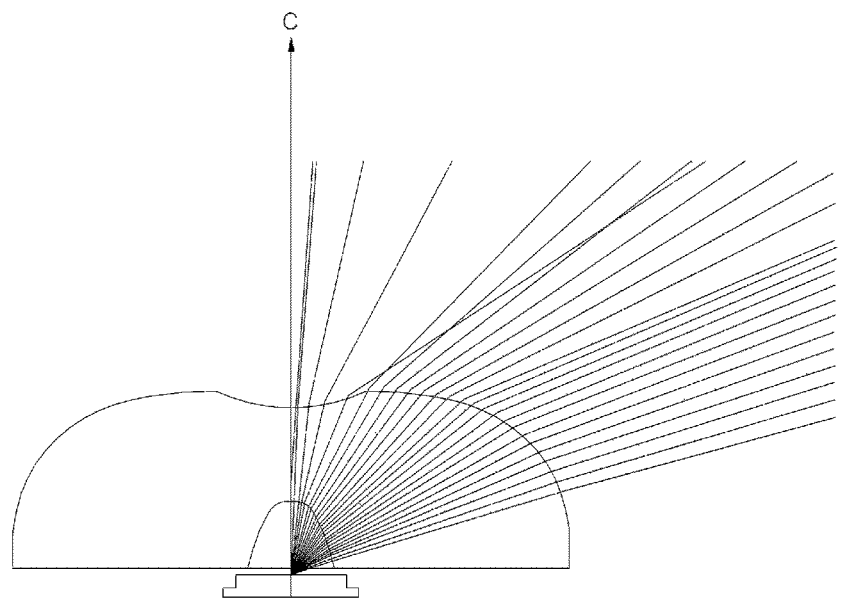
FIG. 23 shows traveling directions of light beams entering the optical member of FIG. 21.

FIGS. 22A, 22B, and 22C show graphs depicting a shape of the optical member of FIG. 21. Here, FIG. 22A is a sectional view of the optical member illustrating reference point P, distance R, angle of incidence $\theta 1$, and exit angle $\theta 5$; FIG. 22B shows variation of distance R according to angle of incidence $\theta 1$; and FIG. 22C shows variation of $\theta 5/\theta 1$ according to angle of incidence $\theta 1$. FIG. 23 shows traveling directions of light beams entering the optical member 130 from reference point P at intervals of 3°.

Referring to FIG. 22A, reference point P indicates a light exit point of the MJT LED 100 placed on the optical axis L. Properly, reference point P is set to be placed on an outer surface of the wavelength conversion layer 125 in order to exclude external factors, such as light scattering by the phosphors in the MJT LED 100 and the like.

$\theta 1$ indicates an angle of incidence of light entering the optical member 130 from the reference point P, and $\theta 5$ indicates an exit angle of light exiting the optical member 130 through the upper surface 135 thereof. R indicates a distance from reference point P to the inner surface of the concave section 131a.

Referring to FIG. 22B, since the upper end surface 133b of the concave section 131a is perpendicular to the central axis C, R slightly increases with increasing $\theta 1$. An enlarged graph in FIG. 22B shows an increasing curve of R. On the side surface 133a of the concave section 131a, R decreases with increasing $\theta 1$ and slightly increases near the entrance of the concave section 131a.

Referring to FIG. 22C, as $\theta 1$ increases, $\theta 5/\theta 1$ rapidly increases near the concave surface 135a and relatively gently decreases near the convex surface 135b. In this embodiment, as shown in FIG. 23, luminous flux exiting the optical member through the concave surface 135a thereof may overlap luminous flux exiting the optical member through the convex surface 135b thereof. That is, among light beams entering the optical member from reference point P, light exiting the optical member through the concave surface 135a near the inflection curve may have a higher refraction angle than light exiting the optical member through the convex surface 135b. Thus, it is possible to reduce concentration of luminous flux near the central axis C by forming the upper end surface 133b of the concave section 131a to have a planar shape and adjusting the shapes of the concave surface 135a and the convex surface 135b.

Figure 24A:
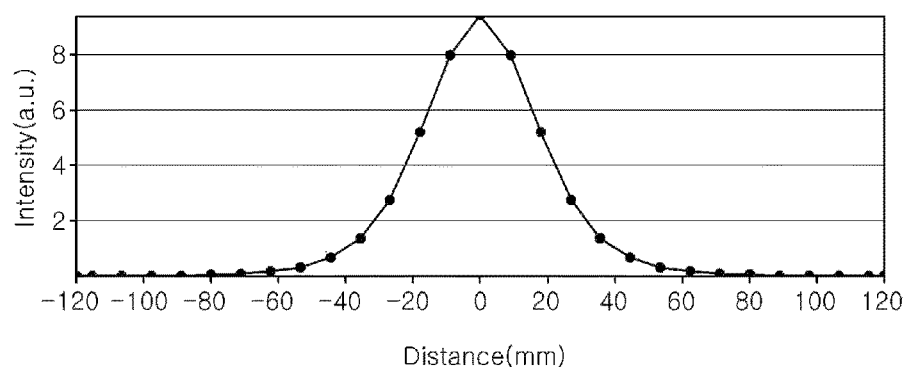
FIG. 24A and FIG. 24B show graphs depicting illuminance distribution. Specifically.
Figure 24B:
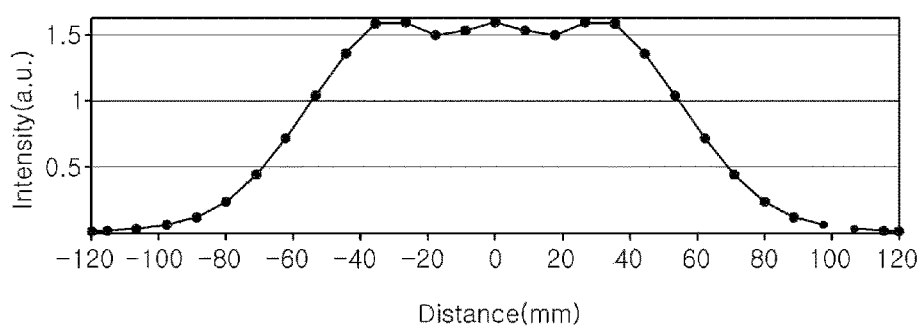

FIGS. 24A and 24B shows graphs depicting illuminance distribution. Specifically, FIG. 24A is a graph depicting illuminance distribution of an MJT LED, and FIG. 24B is a graph showing illuminance distribution of the MJT LED module using an optical member. Illuminance distribution is represented as a magnitude of luminous flux density of light entering a screen separated a distance of 25 mm from a reference point.

As shown in FIG. 24A, the MJT LED 100 provides a bilaterally symmetric illumination distribution with reference to the optical axis (C), and has a luminous flux density which is very high at the center thereof and rapidly decreases towards the periphery thereof. When the optical member 130 is applied to the MJT LED 100, the MJT LED 100 can provide a substantially uniform luminous flux density within a radius of 40 mm, as shown in FIG. 24B.

Figure 25A:
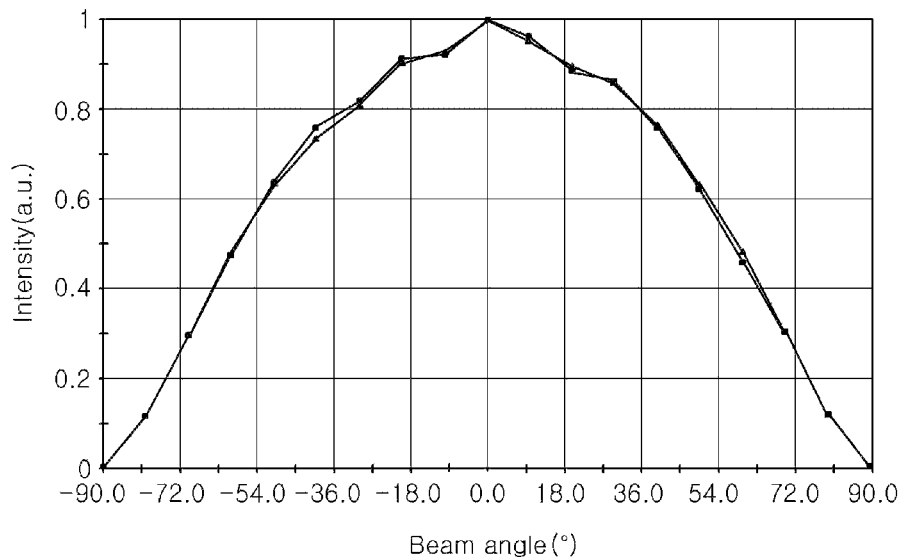
FIG. 25A and FIG. 25B show graphs depicting light beam distributions. Specifically.
Figure 25B:
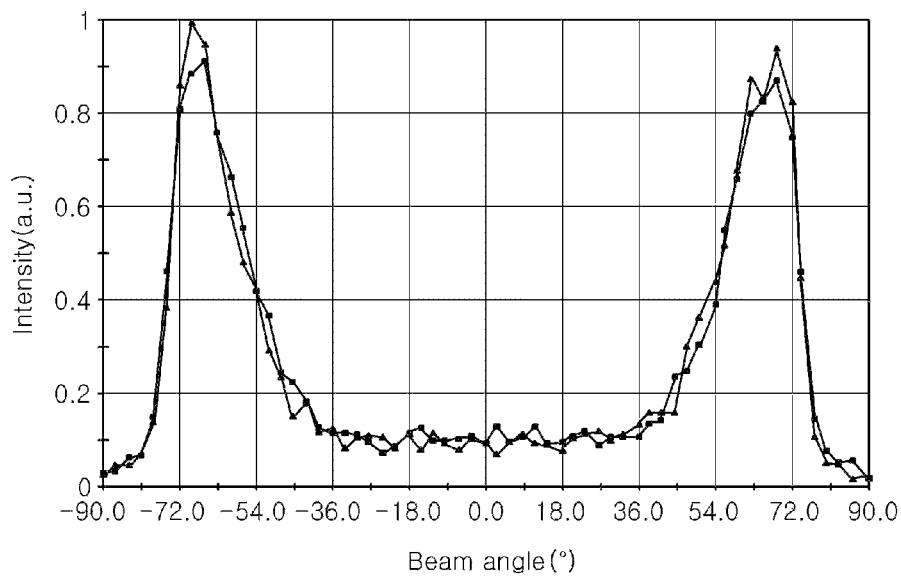

FIGS. 25A and 25B show graphs depicting light beam distributions. Specifically, FIG. 25A is a graph depicting a light beam distribution of an MJT LED, and FIG. 25B is a graph depicting a light beam distribution of the MJT LED module using an optical member. The light beam distribution shows light intensity at a place separated a distance of 5 m from reference point P according to a beam angle, and beam distributions in orthogonal directions are shown to overlap each other in one graph.

As shown in FIG. 25A, the intensity of light emitted from the MJT LED 100 is high at a beam angle of 0°, that is, at the center thereof, and gradually decreases with increasing beam angle. When the optical member is applied to the MJT LED 100, the intensity of light emitted from the MJT LED 100 is relatively low at a beam angle of 0° and is relatively high near a beam angle of 70°, as shown in FIG. 25B.

Accordingly, when the optical member 130 is applied to the MJT LED 100, it is possible to achieve uniform backlighting of a relatively wide area through change of the light beam distribution of the MJT LED, which has high light intensity at the center thereof.

Structure of optical member according to second embodiment and MJT LED module including the same Next, referring to FIG. 26 to FIG. 33B, detailed structures and functions of an optical member according to a second embodiment and an MJT LED module including the same will be described.

Figure 26:
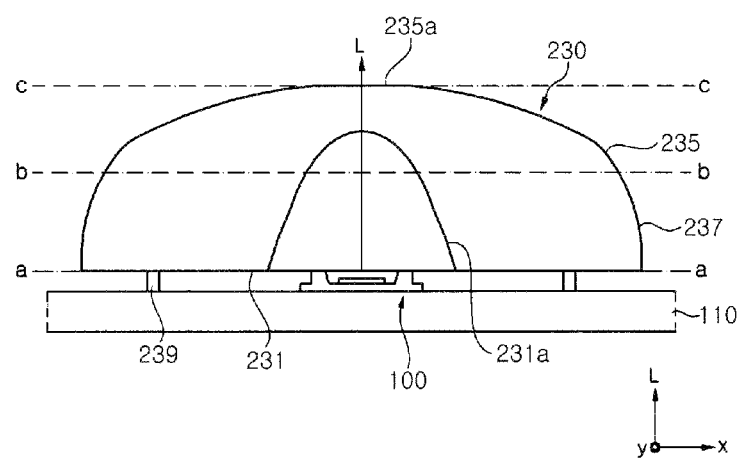
FIG. 26 is a sectional view of an MJT LED module according to one exemplary embodiment of the present disclosure.
Figure 27A:
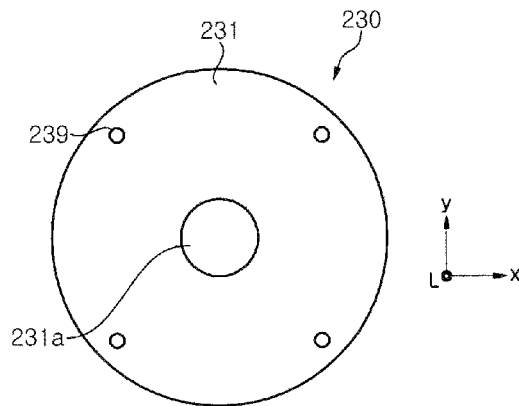
FIG. 27A, FIG. 27B and FIG. 27C illustrate sectional views of the MJT LED module taken along lines a-a, b-b and c-c of FIG. 26, respectively.
Figure 27B:
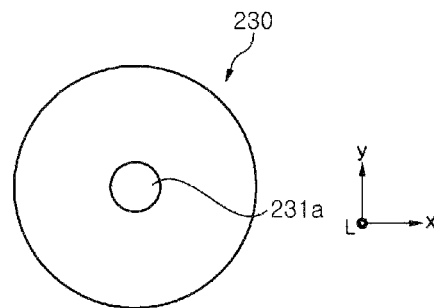
Figure 27C:
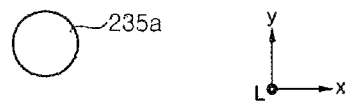
Figure 28:
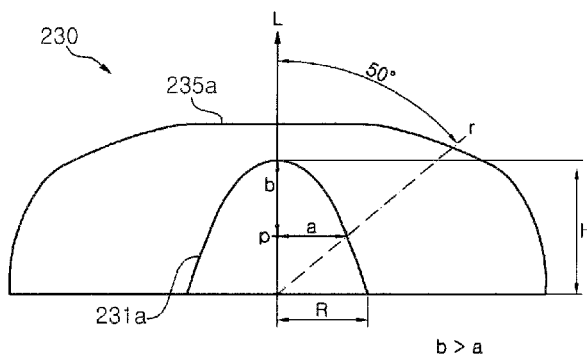
FIG. 28 is a detailed view of an optical member of the MJT LED module shown in FIG. 26.
Figure 29:
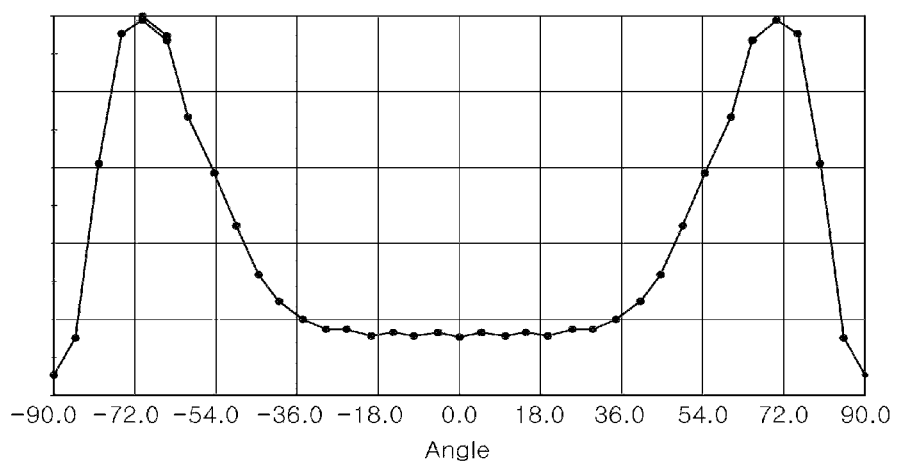
FIG. 29 shows a light beam angle distribution of the MJT LED module using the optical member of FIG. 28.

FIG. 26 is a sectional view of an MJT LED module according to one exemplary embodiment of the present disclosure, and FIG. 27A, FIG. 27B and FIG. 27C are sectional views of the MJT LED module taken along lines a-a, b-b and c-c of FIG. 26. Here, line a-a corresponds to a line on a lower surface of the optical member, line c-c corresponds to a line on an upper surface of the optical member, and line b-b corresponds to a cutting line at the middle of the height of a diffusion lens between line a-a and line c-c. Further, FIG. 28 is a detailed view of an optical member of the MJT LED module shown in FIG. 26, and FIG. 29 shows a light beam angle distribution of the MJT LED module using the optical member of FIG. 28.

Referring to FIG. 26, the MJT LED module includes an MJT LED 100 and an optical member 230 disposed on the MJT LED 100 and formed of a resin or glass material. Although the printed circuit board 110 is partially shown to show a single MJT LED module in this embodiment, a plurality of MJT LED modules is regularly arranged on a single printed circuit board 110 to form the backlight module 300 as described above.

First, the MJT LED 100 and the printed circuit board 110 are the same as those of the first embodiment described above with reference to FIG. 3 and FIG. 4, and detailed descriptions thereof will be omitted. Thus, the optical member 230 according to the second embodiment will be mainly described hereinafter.

Referring to FIG. 26, the optical member 230 includes a lower surface 231 and a light exit face 235 at the opposite side thereof, and may further include legs 239. The lower surface 231 includes a concave light incident section 231a. The light exit face 235 is generally composed of an upwardly protruding round surface, and includes a flat surface 235a formed at an upper center thereof. The flat surface 235a is placed corresponding to a concave section of an optical member such as aspects of the optical member shown in the first embodiment, and the optical member 230 according to the present embodiment can disperse light near the optical axis by the structure of a light incident section 231a described in detail hereinafter even without the concave section at the upper center of the light exit face. The light incident section 231a has a substantially bell-shaped cross-section. That is, the light incident section 231a has a shape which gradually converges from a lower entrance thereof adjacent the MJT LED 100 towards an upper apex thereof.

Referring to FIG. 27A, the lower surface 231 of the optical member 230 has a circular shape. In addition, the light incident section 231a has a lower portion placed at a center of the lower surface 231, and the lower portion of the light incident section 231a has a circular shape. The light incident section 231a maintains a circular shape from the lower entrance immediately before the upper apex thereof, and has a gradually decreasing diameter in an upward direction. Referring to FIG. 27C, the upper flat surface 235a of the optical member 230 also has a circular shape.

Referring to FIG. 27A, FIG. 27B and FIG. 27C in order, the optical member 230 includes the lower surface 231 having a circular shape, and has a gradually decreasing diameter in the upward direction. The optical member 230 may have a greater variation in diameter of a circular outer circumference at an upper portion of a side surface thereof than that of the circular outer circumference at a lower portion of the side surface thereof. The circular shape of the light incident section 231a has a gradually decreasing diameter.

Referring to FIG. 28, an optical axis L corresponding to the central axis of the optical member 230 is shown. To obtain a uniform light distribution using the optical member 230, it is necessary to have a light intensity peak at an angle of 60° or more from the optical axis L. To obtain such optical characteristics, it is important to achieve effective dispersion of light at an angle of 50° or less from the optical axis L. FIG. 28 shows reference line (r) at an angle of 50° or less relative to the optical axis L.

To achieve effective dispersion of light at an angle of 50° or less from the optical axis L, within the range between the optical axis L and the reference line (r), that is, at an angle of 50° or less from the optical axis L, the shortest distance 'b' from a certain point (p) on the optical axis L to the apex of the light incident section 231a is greater than the shortest distance 'a' from the point (p) to the side surface of the light incident section 231a. As above, when b>a, the light incident section 231a can contribute to wide dispersion of light traveling within an angle of 50° or less from the optical axis L to an angle of 60° or more from the optical axis L. In contrast, when b<a, the light incident section 231a fails to contribution to wide dispersion of light traveling within an angle of 50° or less from the optical axis L. As such, it is necessary to form a separate concave section for wide dispersion of light at the upper center of the light exit face in the related art. In other words, the optical member 230 according to the present disclosure employs the curved structure of the light incident section 231a satisfying the condition of b>a within an angle of 50° or less from the optical axis L and thus the concave section at the upper center of the light exit face can be omitted.

Here, the light incident section 231a preferably has a height greater than a radius R of the lower entrance of the light incident section 231a. More preferably, the height H of the light incident section 231a is 1.5 times or more the radius R thereof. In addition, a lower portion of the light incident section 231a adjoins air which has a lower index of refraction than the resin or glass material, and an upper portion of the light exit face also adjoins air which has a lower index of refraction than the resin or glass material.

FIG. 29 shows a light beam angle distribution of the MJT LED module using the optical member of FIG. 28. Referring to FIG. 29, it can be seen that a light intensity peak is formed at about 72° from the optical axis L and light is widely distributed. From the result of FIG. 29, it can be seen that the optical member 230 according to the present disclosure can uniformly disperse light at an angle of 60° or less from the optical axis L through the curved structure of the light incident section 231a satisfying the condition of b>a at an angle of 50° or less from the optical axis L even without the concave section at the upper center of the light exit face, thereby achieving uniform distribution of light.

Figure 30:
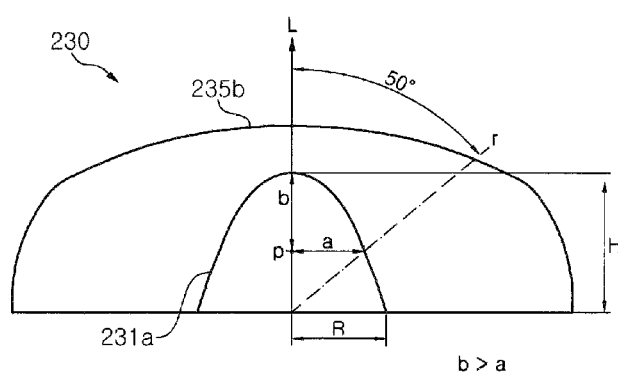
FIG. 30 is a sectional view of an optical member according to another exemplary embodiment of the present disclosure.

FIG. 30 is a sectional view of an optical member according to another exemplary embodiment of the present disclosure. As clearly shown in FIG. 30, the optical member 230 according to this embodiment has the same curved structure of the light incident section 231a as that of the optical member shown in FIG. 28. Thus, the light incident section 231a of the optical member according to this embodiment satisfies the condition of b>a at an angle of 50° or less from the optical axis L. Here, unlike the optical member according to the above embodiment, which has the flat surface formed at the upper center of the light exit face, the optical member 230 according to this embodiment has a convexly round surface 235b at the upper center of the light exit face.

Figure 31:
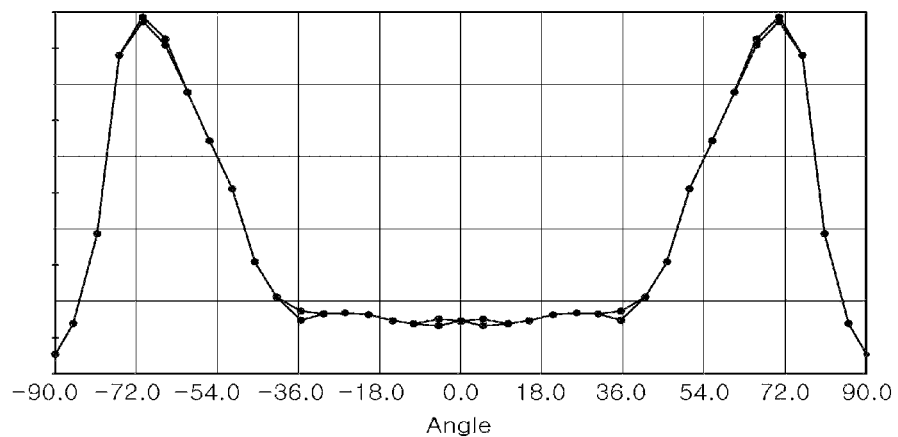
FIG. 31 shows a beam angle distribution curve of an MJT LED module using the optical member of FIG. 30.

FIG. 31 clearly shows a beam angle distribution curve of an MJT LED module using the optical member of FIG. 30. Referring to FIG. 31, it can be seen that a light intensity peak is formed at about 72° from the optical axis L and light is widely distributed. In addition, there is no significant difference between the light beam angle distribution of FIG. 31 and the light beam angle distribution of FIG. 29. Thus, it can be seen that, when the light incident section 231a satisfies the condition of b>a at an angle of 50° or less from the optical axis L, there is no significant difference in light beam angle distribution, regardless of whether the light exit face has the flat surface or the convex surface at the upper center thereof.

Figure 32A:
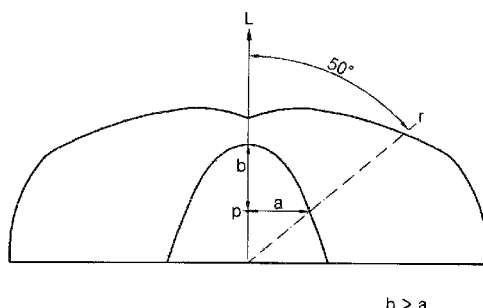
FIG. 32A and FIG. 32B show an optical member according to Comparative Example 1 and a beam angle distribution curve thereof.
Figure 32B:
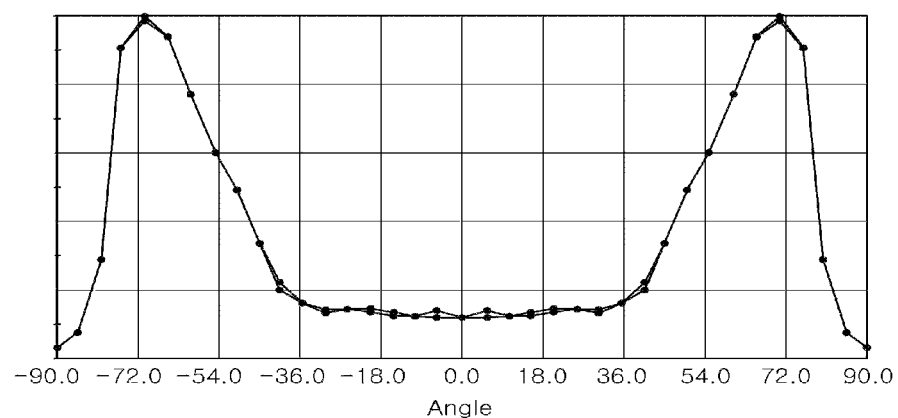

FIGS. 32A and 32B show an optical member according to Comparative Example 1 and a beam angle distribution curve thereof.

In the optical member of FIG. 32A, at an angle of 50° or less from the optical axis L, the shortest distance 'b' from a certain point on the optical axis to an apex of a light incident section is greater than the shortest distance 'a' from the same point to a side surface of the light incident section, and the light exit face has a concave section formed at an upper center thereof. In FIG. 32B showing a beam angle distribution curve under these conditions, it can be seen that there is no substantial difference in light beam angle distribution between the above embodiments and this comparative example. This result means that, under the condition of b>a, the concave section formed at the upper center of the light exit face provides substantially no function in change of the light beam angle distribution.

Figure 33A:
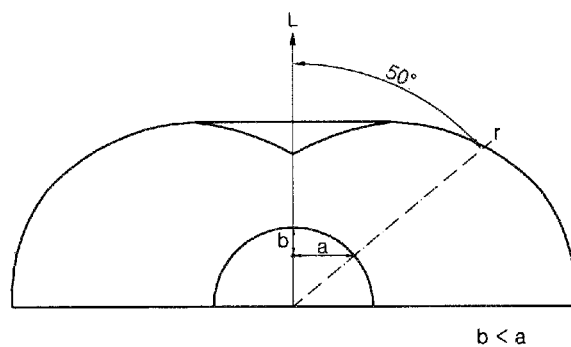
FIG. 33A and FIG. 33B show an optical member according to Comparative Example 2 and a light beam angle distribution thereof.

FIGS. 33A and B show an optical member according to Comparative Example 2 and a light beam angle distribution thereof.

Figure 33B:
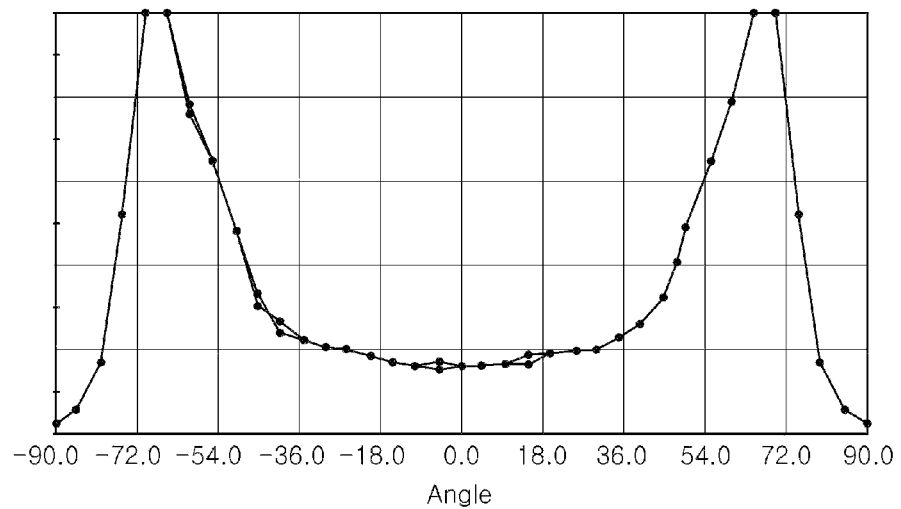

In the optical member of FIG. 33A, at an angle of 50° or less from the optical axis L, the shortest distance 'b' from a certain point on the optical axis to an apex of a light incident section is smaller than the shortest distance 'a' from the same point to a side surface of the light incident section, and the light exit face has a concave section formed at an upper center thereof. In FIG. 33B showing a beam angle distribution curve under these conditions, it can be seen that there is no substantial difference between the light beam angle distribution of Comparative Example 1 and that of the above embodiments. This result means that, under the condition of b<a, the concave section formed at the upper center of the light exit face contributes to wide dispersion of light at an angle of 50° or less from the optical axis L.

Although the present disclosure has been illustrated with reference to some exemplary embodiments in conjunction with the drawings, it should be understood that some features of a certain embodiment may also be applied to other embodiments without departing from the spirit and scope of the disclosure. Further, it should be understood that these embodiments are provided by way of illustration only, and that various modifications and changes can be made without departing from the spirit and scope of the present disclosure.

FIG. 43A and FIG. 43B are schematic views comparing a backlight unit (FIG. 43A) in the related art with a backlight unit (FIG. 43B) according to one exemplary embodiment of the present disclosure.

Referring to FIG. 43A, the backlight unit in the related art includes a plurality of LED chips having a single light emitting cell, and the plurality of LED chips are connected to each other in series and/or in parallel to form one or more arrays 110a, thereby enabling an operation in a unit of each array 110a. On the other hand, in the backlight unit illustrated in FIG. 43B according to one exemplary embodiment of the present disclosure, MJT LEDs may be independently operated without being connected to each other in series, in parallel, or in series/parallel. As a result, for example, the backlight unit in the related art may have 9 arrays 110a, while the backlight unit according to the present disclosure may include 45 blocks.

Depending on the configuration difference as described above, the following effect difference exhibits. It is assumed that the backlight unit in the related art of FIG. 43A is Comparative example, and the backlight unit according to the present disclosure of FIG. 43B is one of Inventive examples. All of the backlight units of Comparative example and the Inventive example have been operated at a DC converter voltage of 24V, and an IC operating voltage was 3V. An operating voltage of an LED chip of a single light emitting cell of Comparative example was 3.6V, and a loss voltage of each array was 3V. In addition, an operating voltage of one MJT LED of the Inventive example was 3.3V, and a loss voltage of each block 110b was 1.2V.

The backlight unit of Comparative example may be operated at 0.4 A, and the backlight unit of the Inventive example may be operated at 0.075 A. As a result, the droop phenomenon occurring at high current may be reduced. In addition, since operation power of Comparative example is 75.6 W, and operating power of the Inventive example is 70.87 W, loss power of Comparative example was 10.8 W and loss power of Inventive example was 4.05 W, and operating efficiency calculated based on those described above was 85.7% (Comparative example) and 94.2% (Inventive example), respectively. Thus, it may be confirmed that the operating efficiency of the backlight unit according to the present disclosure is higher than that of the related art.

According to one or more exemplary embodiments of the present disclosure, the backlight module is fabricated using the MJT LEDs having low current operation characteristics, thereby enabling low current operation of the backlight module and the backlight unit including the same.

In addition, according to one or more exemplary embodiments of the present disclosure, one connection section of the interconnection line electrically contacts a slanted side surface of the light emitting cell, thereby increasing an effective light emitting area of each of light emitting cells in an MJT LED chip.

Further, according to one or more exemplary embodiments of the present disclosure, it is possible to enhance stability and reliability of drive circuits for controlling operation of the backlight module while reducing manufacturing costs.

Further, according to one or more exemplary embodiments of the present disclosure, the backlight unit has improved power efficiency and luminous efficacy, and can prevent a droop phenomenon due to operation at high current.

Further, according to one or more exemplary embodiments of the present disclosure, it is possible to minimize or reduce the number of LEDs constituting the backlight module and to allow an individual operation of the MJT LEDs constituting the backlight module.

What is claimed is:

1. A direct type backlight unit disposed under a liquid crystal panel, comprising:
   a backlight module comprising:
   a printed circuit board comprising blocks arranged in an M×N matrix, M and N being natural numbers of 2 or greater;
   light emitting devices disposed on the printed circuit board such that at least one light emitting device is disposed in each of the blocks, each of the light emitting devices comprising light emitting cells disposed on a single substrate; and
   optical members disposed on the light emitting devices, each of the optical members being configured to change a light beam distribution of a corresponding light emitting device; and
   a backlight control module configured to control dimming levels of the light emitting devices and to independently control the light emitting devices disposed in different blocks,
   wherein the light emitting devices in the blocks are not electrically connected to each other in series or in parallel.

2. The backlight unit of claim 1, wherein each of the blocks has a horizontal length of 60 mm or less and a vertical length of 55 mm or less.

3. The backlight unit of claim 1, wherein each of the optical members is disposed on the printed circuit board to correspond to each of the light emitting devices.

4. The backlight unit of claim 1, wherein each of the optical members is disposed directly on each of the light emitting devices.

5. The backlight unit of claim 1, wherein:
   each of the optical members comprises a lower surface and an upper surface;
   the lower surface comprises a concave section having a substantially circular disc shape disposed on the central portion thereof; and
   the upper surface comprises a concave surface and at least one convex surface.

6. The backlight unit of claim 5, wherein the concave section of the lower surface comprises at least one surface perpendicular with respect to a central axis of the optical member.

7. The backlight unit of claim 5, further comprising a refraction layer disposed on the concave surface of the optical member,
  wherein an index of refraction of the refraction layer is higher than that of the optical member.

8. The backlight unit of claim 5, wherein each of the blocks comprises one optical member.

9. The backlight unit of claim 5, wherein:
  at least one of the light emitting device comprises first to $N^{th}$ light emitting cells, N being a natural number greater than 2; and
  a configuration of an electrical connection between the $N^{th}$ light emitting cell and an $N-1^{th}$ light emitting cell is the same as that between the first light emitting cell and a second light emitting cell.

10. The backlight unit of claim 9, wherein the first to $N^{th}$ light emitting cells are connected to each other in series.

11. The backlight unit of claim 1, wherein the backlight control module further comprises:
  an operation power generator configured to provide an operating voltage to the light emitting devices; and
  an operation controller configured to perform a dimming control of the light emitting devices.

12. The backlight unit of claim 11, wherein the operation controller is configured to perform the dimming control by performing a pulse width modulation (PWM) control.

13. The backlight unit of claim 11, wherein the operation controller is configured to independently control a dimming level of each of the light emitting devices.

14. The backlight unit of claim 11, wherein:
  each of the light emitting devices comprises an anode terminal and a cathode terminal;
  the anode terminal of each of the light emitting devices is directly connected to the operation power generator; and
  the cathode terminal of each of the light emitting devices is directly connected to the operation controller.

15. The backlight unit of claim 11, wherein the operation controller is configured to independently control a dimming level of each of the blocks comprising the at least one light emitting device.

16. The backlight unit of claim 15, wherein:
  each of the blocks comprises an anode terminal of a first light emitting device disposed thereon and a cathode terminal of a second light emitting device disposed thereon; and
  the anode terminal of each of the blocks is directly connected to the operation power generator and the cathode terminal of each of the blocks is directly connected to the operation controller.

17. The backlight unit of claim 15, wherein the light emitting devices in each of the blocks are connected to each other in series.

18. The backlight unit of claim 11, wherein the operating voltage of each of the blocks is about 6V to about to 36V.

19. A display device comprising:
  a liquid crystal panel;
  a direct type backlight unit disposed under the liquid crystal panel and comprising:
    a backlight module comprising:
      a printed circuit board comprising blocks arranged in an M×N matrix, M and N being natural numbers of 2 or greater;
      light emitting devices disposed on the printed circuit board such that at least one light emitting device is disposed in each of the blocks, each of the light emitting devices comprising light emitting cells disposed on a single substrate; and
      optical members disposed on the light emitting devices, each of the optical members being configured to change a light beam distribution of a corresponding light emitting device; and
  a backlight control module configured to control dimming levels of the light emitting devices and to independently control the light emitting devices disposed in different blocks,
  wherein the light emitting devices in the blocks are not electrically connected to each other in series or in parallel.

20. The display device of claim 19, wherein:
  each of the optical members comprises a lower surface and an upper surface;
  the lower surface comprises a concave section having a substantially circular disc shape disposed at a central portion thereof; and
  the upper surface comprises a concave surface and at least one convex surface.

* * * * *